(12) United States Patent
Kim et al.

(10) Patent No.: US 10,692,947 B2
(45) Date of Patent: Jun. 23, 2020

(54) LIGHT EMITTING DISPLAY DEVICE AND METHOD OF MANUFACTURING THE SAME

(71) Applicant: LG DISPLAY CO., LTD., Seoul (KR)

(72) Inventors: JongSung Kim, Paju-si (KR); Ho-Jin Kim, Seoul (KR); SeungMin Baik, Gimpo-so (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/786,169

(22) Filed: Oct. 17, 2017

(65) Prior Publication Data

US 2018/0166522 A1 Jun. 14, 2018

(30) Foreign Application Priority Data

Dec. 14, 2016 (KR) ........................ 10-2016-0170350

(51) Int. Cl.
*H01L 27/32* (2006.01)
(52) U.S. Cl.
CPC ...... *H01L 27/3248* (2013.01); *H01L 27/3223* (2013.01); *H01L 27/3262* (2013.01); *H01L 27/3276* (2013.01); *H01L 27/3246* (2013.01); *H01L 27/3258* (2013.01); *H01L 2227/323* (2013.01); *H01L 2251/5392* (2013.01)
(58) Field of Classification Search
CPC ............ H01L 27/3248; H01L 27/3276; H01L 27/3262; H01L 27/3223; H01L 27/3258; H01L 2227/323; H01L 2251/5392; H01L 27/3246; H01L 27/3244
See application file for complete search history.

(56) References Cited

U.S. PATENT DOCUMENTS

| 9,853,095 B2* | 12/2017 | Kajiyama ........... H01L 27/3262 |
| 9,887,241 B2* | 2/2018 | Yamazaki ........... G09G 3/3233 |
| 2009/0244465 A1* | 10/2009 | Oyamada .......... G02F 1/133512 349/139 |
| 2010/0033804 A1* | 2/2010 | Aoki ................ G02F 1/136227 359/296 |
| 2013/0001533 A1 | 1/2013 | Kim et al. |

(Continued)

FOREIGN PATENT DOCUMENTS

| KR | 10-2014-0077690 A | 6/2014 |
| TW | 201306248 A1 | 2/2013 |
| WO | 2016/072598 A1 | 5/2016 |

*Primary Examiner* — Benjamin Tzu-Hung Liu
(74) *Attorney, Agent, or Firm* — Seed IP Law Group LLP

(57) ABSTRACT

Disclosed are a light emitting display device and a method of manufacturing the same, which prevent a lifetime of a light emitting layer from being shortened and prevent occurrence of a turn-on defect. The light emitting display device includes a plurality of pixels each including a transistor having a gate electrode, an active layer overlapping the gate electrode, a source electrode connected to one side of the active layer, and a drain electrode connected to another side of the active layer. The pixels further include a light emitting device having a first electrode, a light emitting layer disposed on the first electrode, and a second electrode disposed on the light emitting layer. The light emitting display device includes a contact hole, and the first electrodes of at least two of the pixels are electrically connected to side surfaces of respective source electrodes or to side surfaces of respective drain electrodes in the contact hole.

19 Claims, 29 Drawing Sheets

(56) References Cited

U.S. PATENT DOCUMENTS

| | | |
|---|---|---|
| 2014/0152171 A1 | 6/2014 | Kondoh |
| 2015/0053955 A1 | 2/2015 | Furuie et al. |
| 2015/0123113 A1* | 5/2015 | Park .................... H01L 27/1244 257/43 |
| 2016/0300855 A1* | 10/2016 | Cheng ................... H01L 27/124 |
| 2017/0147116 A1 | 5/2017 | Lee et al. |

* cited by examiner

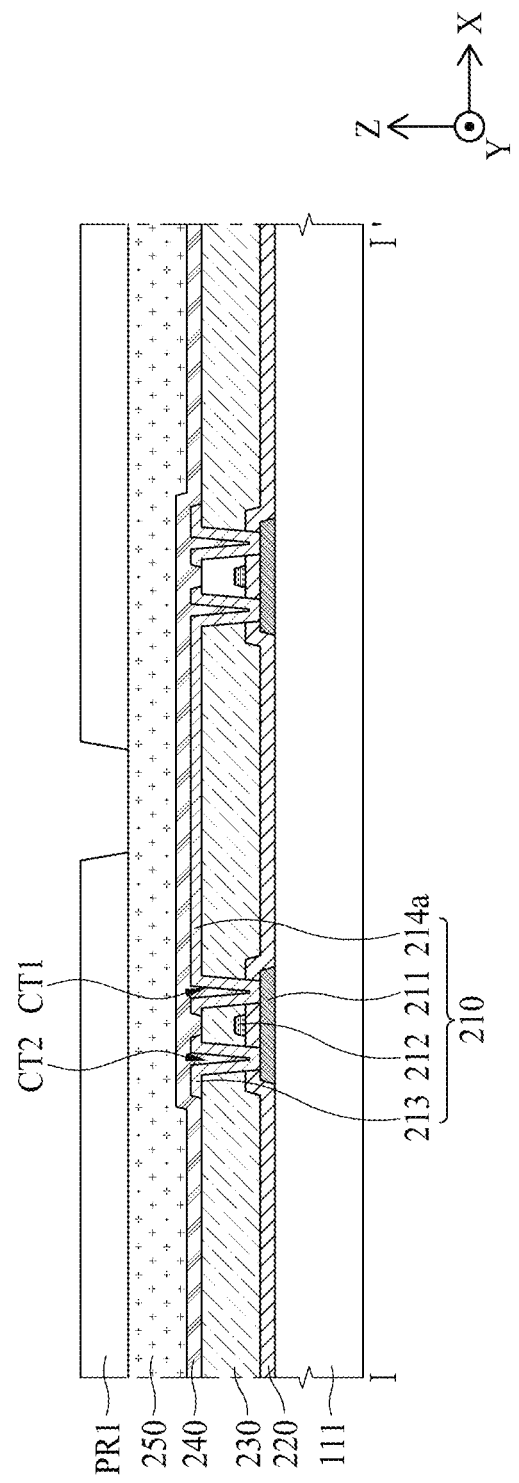

LIGHT EMITTING DISPLAY DEVICE AND METHOD OF MANUFACTURING THE SAME

CROSS-REFERENCE TO RELATED APPLICATIONS

This application claims the benefit of the Korean Patent Application No. 10-2016-0170350 filed on Dec. 14, 2016, which is hereby incorporated by reference as if fully set forth herein.

BACKGROUND

Technical Field

The present disclosure relates to a light emitting display device and a method of manufacturing the same.

Description of the Related Art

With the advancement of information-oriented society, various requirements for display devices for displaying an image are increasing. Therefore, various display devices such as liquid crystal display (LCD) devices, plasma display panel (PDP) devices, light emitting display devices, etc. are being used recently.

The light emitting display devices including organic light emitting display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include anode electrodes, a bank that divides the anode electrodes, a hole transporting layer, an organic light emitting layer, and an electron transporting layer that are formed on the anode electrodes, and a cathode electrode formed on the electron transporting layer. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

In the organic light emitting display devices, pixels that emit light are formed in respective areas where an anode electrode, an organic light emitting layer, and a cathode electrode are sequentially stacked. A bank is provided in respective non-emissive areas that do not emit light. That is, the bank functions as a pixel defining layer that defines the pixels.

The anode electrode is connected to a source or drain electrode of a thin film transistor (TFT) through a contact hole and is supplied with a high-level voltage through the TFT. Due to a step height of the contact hole, it is difficult for the organic light emitting layer to be uniformly deposited in the contact hole, and for this reason, the organic light emitting layer is covered by the bank without being formed in the contact hole.

Recently, head-mounted displays each including an organic light emitting display device are being developed. The head-mounted displays are monitor devices for virtual reality (VR) or augmented reality (AR), which are worn in a glasses type or a helmet type and form a focal point at a distance close to eyes of a user. Small organic light emitting display devices, applied to the head-mounted displays, mobile devices, etc., have a high resolution, and thus, a size of each pixel is progressively reduced.

However, the contact hole is formed through a photo process, and due to a limitation of the photo process, the contact hole cannot be formed to have a certain size or less. That is, although a size of a pixel is reduced, there is a limitation in decreasing a size of the contact hole. Particularly, the contact hole is disposed in the non-emissive area, and thus, when the size of the pixel is reduced, an area ratio of the non-emissive area in the pixel increases, and an area ratio of an emissive area in the pixel is decreased. If the area ratio of the emissive area in the pixel is decreased, a luminance of the emissive area should be increased in order to compensate for the decreased ratio of the emissive area, and for this reason, a lifetime of the organic light emitting layer is shortened.

Moreover, if the size of the pixel is reduced, a size of the source or drain electrode of the TFT can become less than that of the contact hole. In this case, the anode electrode is not formed on only an upper surface of the source or drain electrode exposed through the contact hole and may be formed on a floor of the contact hole and a side surface of the source or drain electrode. Therefore, as illustrated in FIGS. 1A and 1B, due to a step height between the floor of the contact hole and the source or drain electrode, the anode electrode can be disconnected in the side surface of the source or drain electrode. For this reason, a turn-on defect where the pixel does not emit light can occur.

BRIEF SUMMARY

Accordingly, the present disclosure is directed to provide a light emitting display device and a method of manufacturing the same that substantially obviate one or more problems due to limitations and disadvantages of the related art.

An aspect of the present disclosure is directed to provide a light emitting display device and a method of manufacturing the same, which prevent a lifetime of a light emitting layer from being shortened.

Another aspect of the present disclosure is directed to provide a light emitting display device and a method of manufacturing the same, which prevent occurrence of a turn-on defect.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display device including a plurality of pixels, each of the pixels including: a transistor having a gate electrode, an active layer overlapping the gate electrode, a source electrode connected to one side of the active layer, and a drain electrode connected to another side of the active layer; and a light emitting device having a first electrode, a light emitting layer disposed on the first electrode, and a second electrode disposed on the light emitting layer. A contact hole is included, and the first electrodes of at least two of the pixels are electrically connected to side surfaces of respective source electrodes or to side surfaces of respective drain electrodes in the contact hole.

In another aspect of the present disclosure, there is provided a light emitting display device that includes a plurality of pixels and a contact hole. Each of the plurality of pixels includes: a transistor having a gate electrode, a source region, and a drain region; a source electrode coupled to the source region; a drain electrode coupled to the drain region; an auxiliary electrode coupled to one of the source electrode or the drain electrode; and a first electrode of a light emitting device coupled to the auxiliary electrode. The first electrodes of at least two of the pixels are electrically connected to side surfaces of respective auxiliary electrodes in the contact hole.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 8A to 8F are cross-sectional views taken along line I-I' for describing the method of manufacturing an organic light emitting display device of FIG. 7, according to embodiments of the present disclosure;

DETAILED DESCRIPTION

Figure 1A:
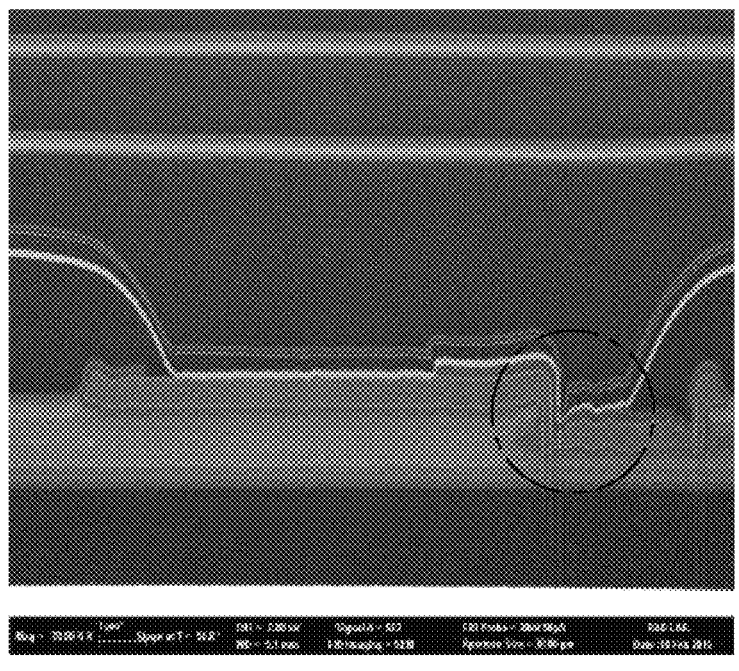
FIGS. 1A and 1B are exemplary diagrams showing an example where when an organic light emitting layer is formed in a contact hole, an anode electrode is short-circuited with a cathode electrode due to a step height of the contact hole.
Figure 1B:
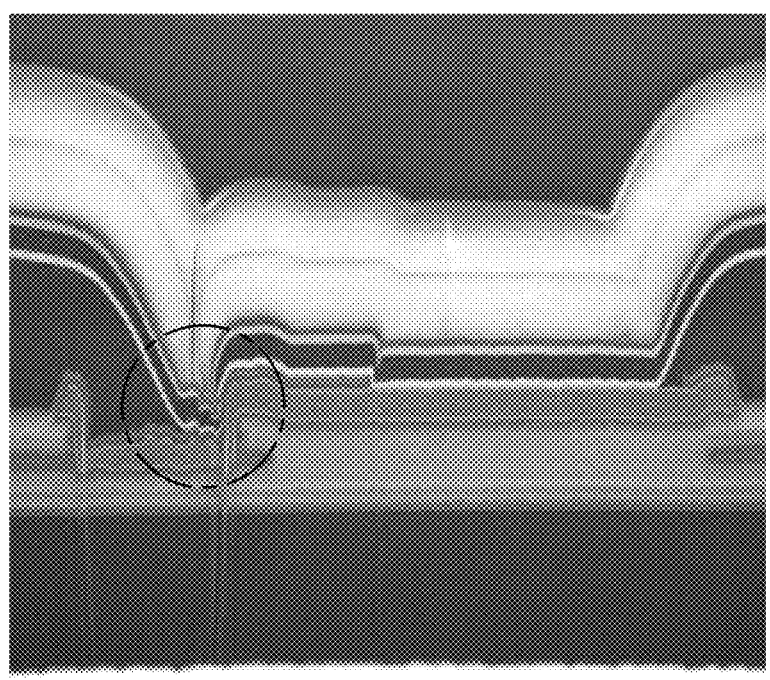

Reference will now be made in detail to the exemplary embodiments of the present disclosure, examples of which are illustrated in the accompanying drawings. Wherever possible or convenient for describing the various embodiments provided herein, the same reference numbers will be used throughout the drawings to refer to the same or like parts.

In the following description, the detailed description of well-known functions, features or configurations may be omitted where inclusion of such description may otherwise obscure the description of the various embodiments of the present disclosure. The terms described in the specification should be understood as follows.

Advantages and features of the present disclosure, and implementation methods thereof will be provided by the following exemplary embodiments described with reference to the accompanying drawings. The present disclosure may, however, be embodied in different forms and should not be construed as limited to the particular embodiments set forth herein. Rather, these embodiments are provided so that this disclosure will be thorough and complete, and will convey the scope of the present disclosure to those skilled in the art.

A shape, a size, a ratio, an angle, and a number disclosed in the drawings for describing embodiments of the present disclosure are merely exemplary, and thus, the present disclosure is not limited to the illustrated details.

Terms such as 'comprise', 'have', and 'include' are used in the present specification to have an inclusive meaning, and additional parts, components, features or the like may be included, unless expressly limited by terms such as 'only'. The terms of a singular form may include plural forms unless explicitly limited to the singular form.

In construing an element, the element is construed as including an error range although there may not be any explicit description of such error range.

In describing a positional relationship, for example, when a positional relation between two parts is described as 'on', 'over', 'under', and 'next', one or more other parts may be disposed between the two parts unless expressly limiting terms such as 'just' or 'direct' are used.

In describing a time relationship, for example, when the temporal order is described as 'after', 'subsequent', 'next', and 'before', a case which is not continuous in order may be included unless expressly limiting terms such as 'just' or 'direct' are used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction, as used herein, should not be construed as denoting any particular geometric relationship or orientation (e.g., a vertical or horizontal orientation), but are instead intended to have a broader directionality within a scope where elements of the present disclosure operate functionally.

The term "at least one" should be understood as including any and all combinations of one or more of the associated listed items. For example, the meaning of "at least one of a first item, a second item, and a third item" includes all combinations of two or more of any of the first, second, and third items, as well as any of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, exemplary embodiments of the present disclosure will be described in detail with reference to the accompanying drawings.

Figure 2:
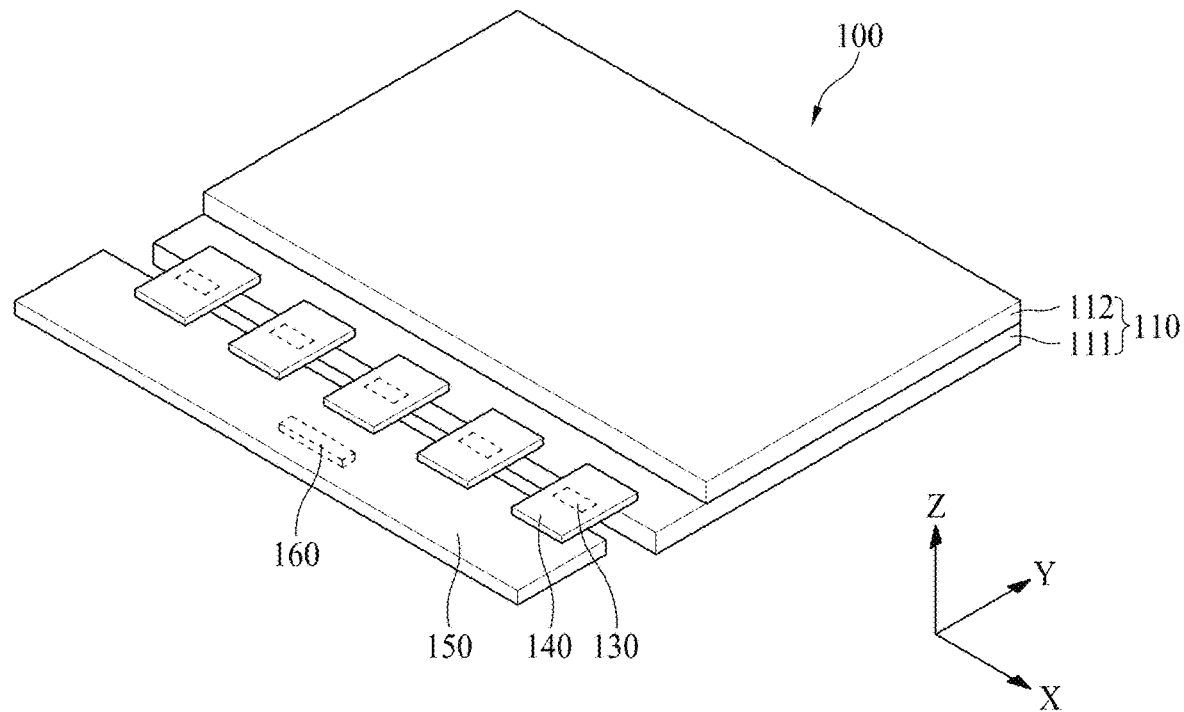
FIG. 2 is a perspective view illustrating an organic light emitting display device according to one or more embodiments of the present disclosure.
Figure 3:
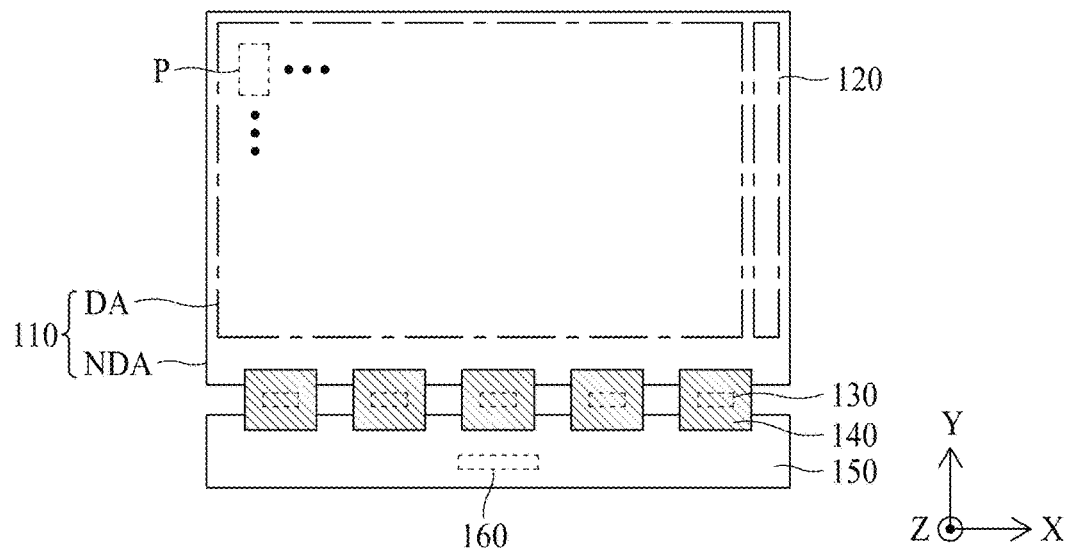
FIG. 3 is a plan view illustrating further details of the organic light emitting display device of FIG. 2.

FIG. 2 is a perspective view illustrating an organic light emitting display device 100 according to an embodiment of the present disclosure. FIG. 3 is a plan view illustrating further details of the organic light emitting display device 100 of FIG. 2, such as a first substrate, a gate driver, a source drive integrated circuit (IC), a flexible film, a circuit board, and a timing controller.

Referring to FIGS. 2 and 3, the organic light emitting display device 100 according to an embodiment of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

A plurality of gate lines, a plurality of data lines, and a plurality of pixels P may be provided on a surface of the first substrate 111 that faces the second substrate 112. The pixels may be respectively provided in a plurality of areas defined by an intersection structure of the gate lines and the data lines.

Each of the pixels may include a thin film transistor (TFT) and an organic light emitting device which includes a first electrode, an organic light emitting layer, and a second electrode. When a gate signal is input through a gate line, each of the pixels may supply a certain current to the organic light emitting device by using the TFT according to a data voltage supplied through a data line. Therefore, the organic light emitting device of each of the pixels may emit light having a certain brightness according to the certain current. Various embodiments of pixels will be described in further detail herein.

The display panel 110, as illustrated in FIG. 3, may be divided into a display area DA, where the pixels are provided to display an image, and a non-display area NDA which does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source drive IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads by an anisotropic conductive film, and thus, the pads may be connected to the lines of the flexible film 140.

The circuit board 150 may be attached on the flexible film 140, which may be provided as a plurality of flexible films 140, as shown. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120 and a source control signal for controlling the source drive IC 130, which may be provided as a plurality of source drive ICs 130, based on the timing signal. The timing controller 160 may supply the gate control signal to the gate driver 120 and may supply the source control signal to the plurality of source drive ICs 130.

Figure 4:
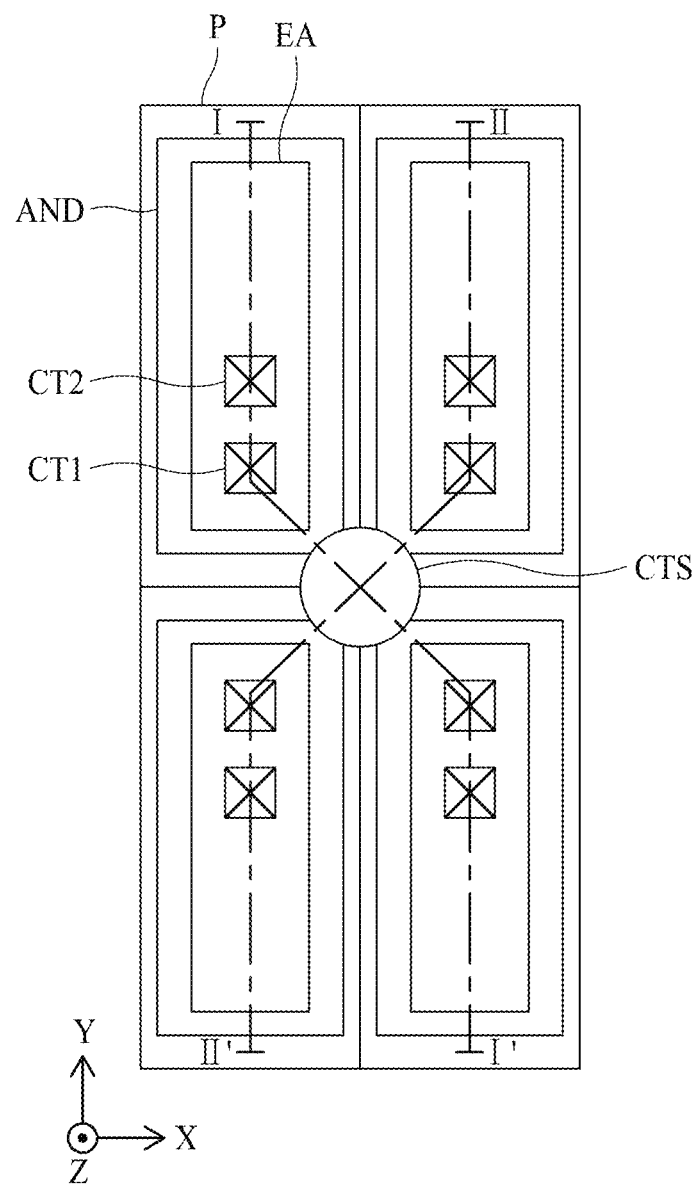
FIG. 4 is a plan view illustrating in detail an example of pixels in a display area, in accordance with one or more embodiments of the present disclosure.

FIG. 4 is a plan view illustrating in detail an example of pixels in a display area.

In FIG. 4, for convenience of description, only a pixel P, a first electrode AND of an organic light emitting device, an emissive area EA, first and second contact holes CT1 and CT2, and a shared contact hole CTS are illustrated.

Referring to FIG. 4, a plurality of pixels P may be provided, and each of the pixels P may include at least one TFT and an organic light emitting device.

The TFT may include an active layer, a gate electrode overlapping the active layer, a source electrode connected to one side of the active layer, and a drain electrode connected to the other side of the active layer. The active layer may include a source region, a drain region and a channel region between the source region and the drain region. The source electrode may thus be connected to the source region of the active layer, and the drain electrode may be connected to the drain region of the active layer.

The organic light emitting device may include the first electrode AND corresponding to an anode electrode, an organic light emitting layer, and a second electrode corresponding to a cathode electrode. The emissive area EA may denote an area where the first electrode AND, the organic light emitting layer, and the second electrode are sequentially stacked, and a hole from the first electrode AND and an electron from the second electrode are combined in the organic light emitting layer to emit light. The emissive area EA of adjacent pixels P may be separated by a bank, and thus, the bank may correspond to a non-emissive area that does not emit light.

The first contact hole CT1 may be a contact hole which is formed for connecting the drain electrode of the TFT to the active layer. Therefore, the drain electrode of the TFT may be connected to the active layer through the first contact hole CT1.

The second contact hole CT2 may be a contact hole which is formed for connecting the source electrode of the TFT to the active layer. Therefore, the source electrode of the TFT may be connected to the active layer through the second contact hole CT2.

N (where N is an integer equal to or more than two) number of pixels P, as in FIG. 4, may share the shared contact hole CTS. The shared contact hole CTS may be a hole that exposes the drain electrode of the TFT of each of the N pixels P. That is, the drain electrodes of the TFTs of the N pixels P may be exposed through the shared contact hole CTS. The first electrode AND of the organic light emitting device of each of the N pixels P may be connected to the drain electrode of a corresponding TFT by the shared contact hole CTS.

Figure 13A:
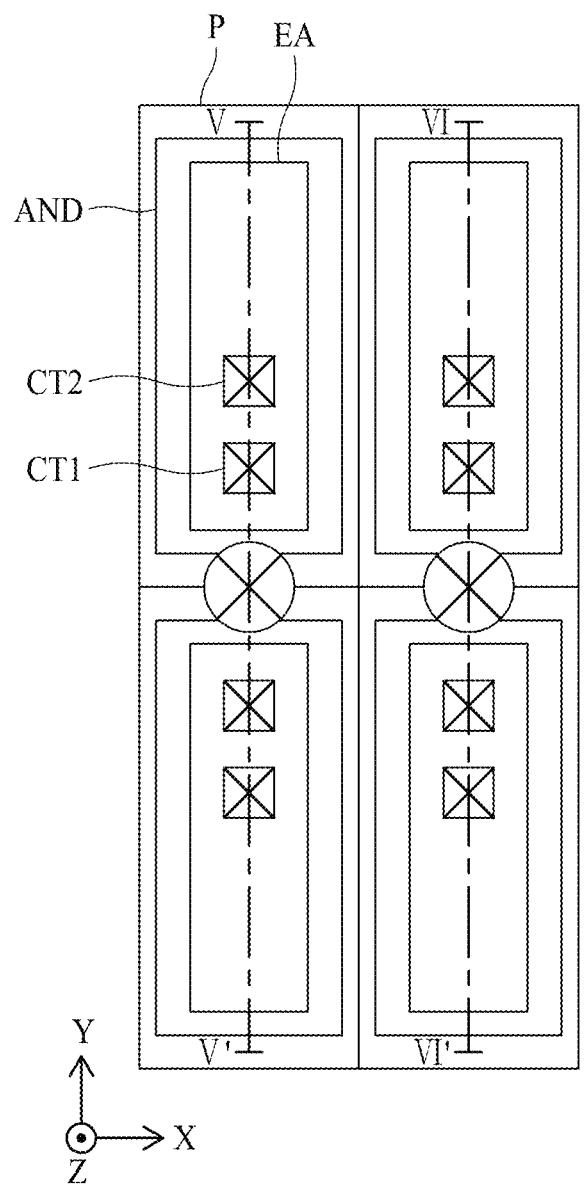
FIGS. 13A and 13B are plan views illustrating in detail further examples of pixels in a display area, in accordance with embodiments of the present disclosure.
Figure 14A:
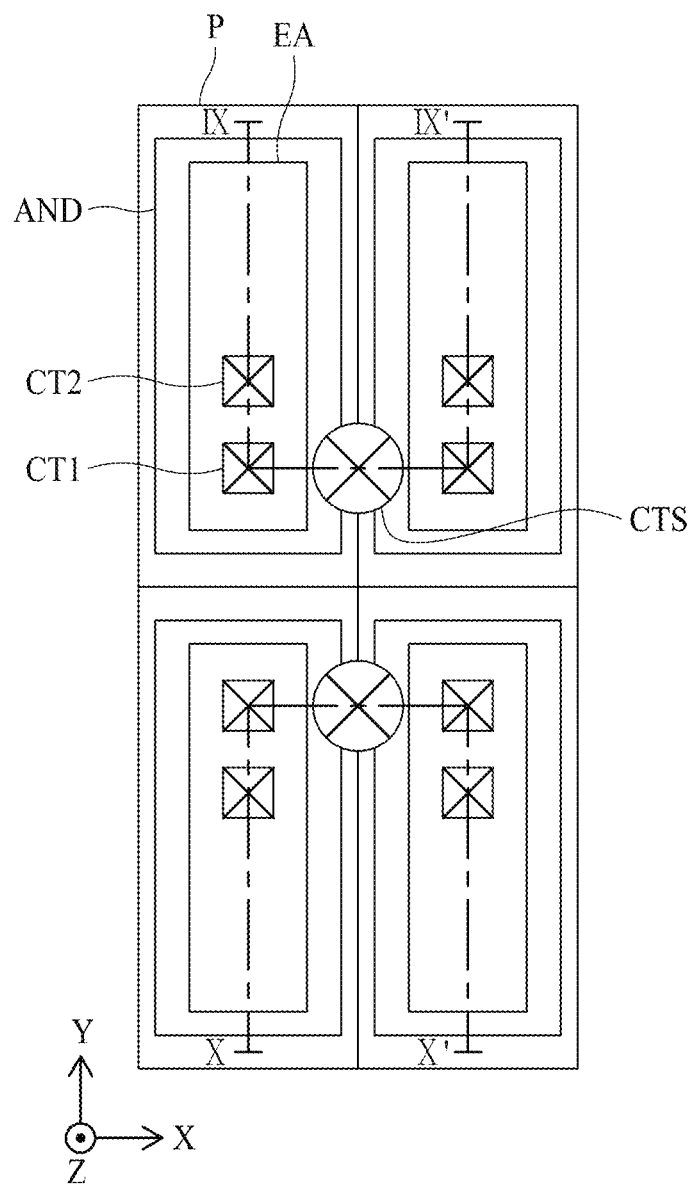
FIGS. 14A and 14B are plan views illustrating in detail further examples of pixels in a display area, in accordance with embodiments of the present disclosure.
Figure 15A:
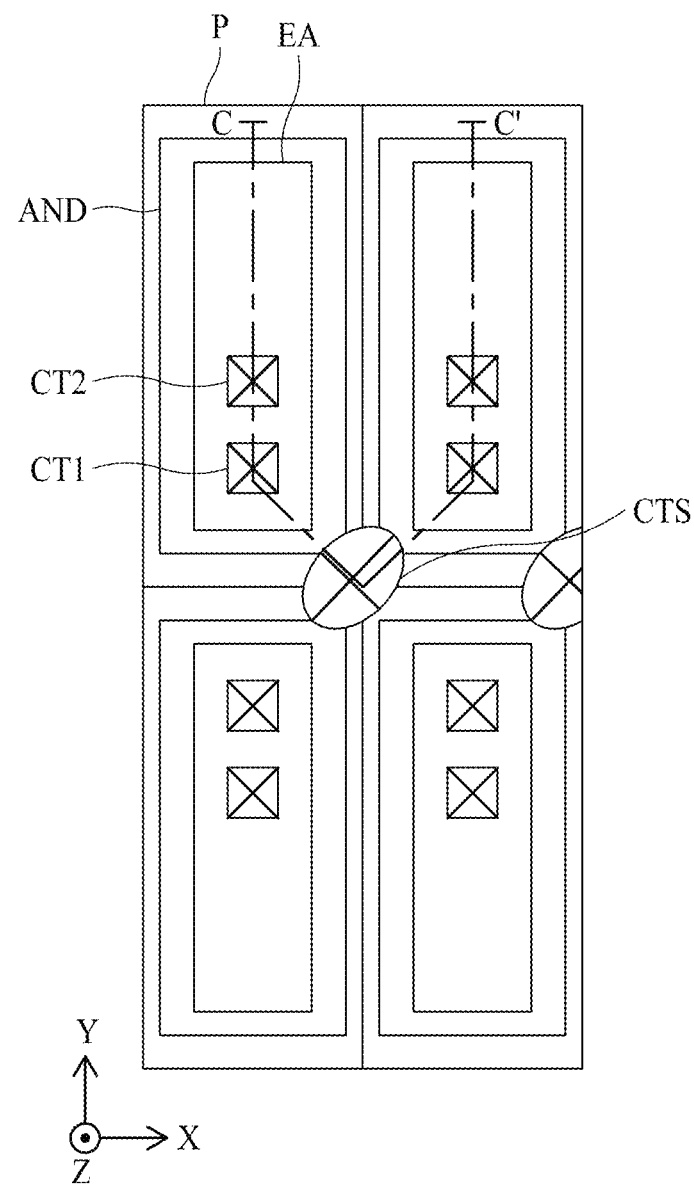
FIGS. 15A and 15B are plan views illustrating in detail further examples of pixels in a display area, in accordance with embodiments of the present disclosure.

In FIG. 4, N is illustrated as four (N=4), but the present embodiments are not limited thereto. For example, as shown in FIGS. 13A and 14A, N may be two (N=2), and as shown in FIG. 15A, N may be three (N=3). Even when N=2, as in FIG. 13A, pixels P which are adjacent to each other in a first direction (e.g., a Y axis direction) may share the shared contact hole CTS, and as in FIG. 14A, pixels P which are adjacent to each other in a second direction (e.g., an X axis direction) intersecting the first direction (e.g., the Y axis direction) may share the shared contact hole CTS. Also, when N=3, as in FIG. 15A, pixels P which are adjacent to each other in a triangular shape may share the shared contact hole CTS.

As described above, in an embodiment of the present disclosure, the N pixels P may share the shared contact hole CTS for connecting the first electrode of the organic light emitting device to the drain electrode of the TFT. Accordingly, in an embodiment of the present disclosure, the emissive area EA is prevented from being reduced by a contact hole, thereby preventing a lifetime of the organic light emitting layer from being shortened due to the reduction in the emissive area EA.

In FIG. 4, for convenience of description, the shared contact hole CTS is described as exposing the drain electrode of the TFT, but the present embodiments are not limited thereto. In other embodiments, the shared contact hole CTS may expose the source electrode of the TFT.

Figure 5:
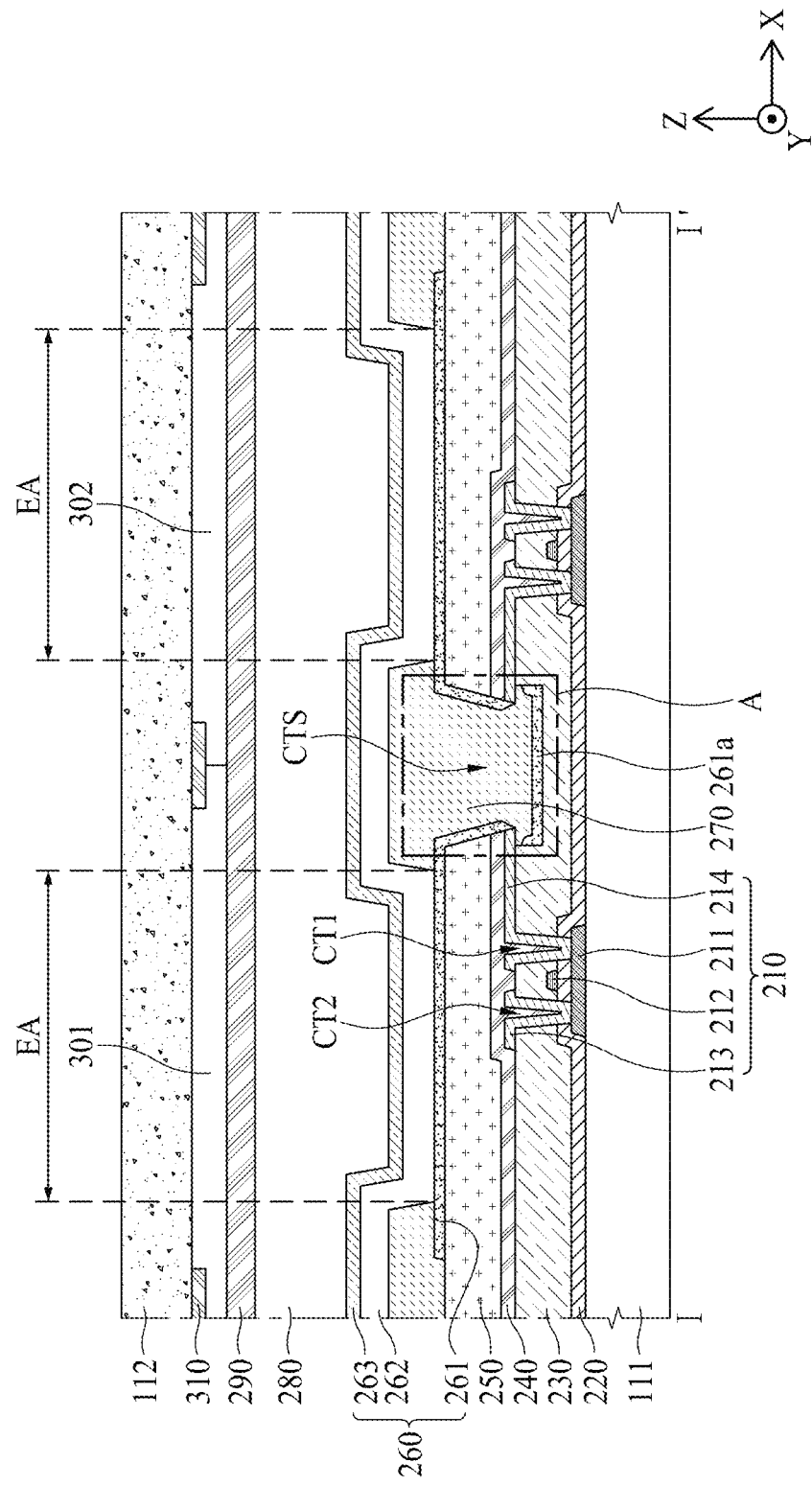
FIG. 5 is a cross-sectional view taken along line I-I' of FIG. 4.

FIG. 5 is a cross-sectional view illustrating an example taken along line I-I' of FIG. 4.

Referring to FIG. 5, a buffer layer (not shown) may be formed on a surface of the first substrate 111 that faces the second substrate 112. The buffer layer may be formed on the surface of the first substrate 111, for protecting a plurality of TFTs 210 and a plurality of organic light emitting devices 260 from water which penetrates through the first substrate 111, which may be vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted in various embodiments.

The TFTs 210 may be formed on the buffer layer. In FIG. 5, a first electrode 261 of each of the pixels P is illustrated as being connected to a drain electrode 214 of at least one TFT, but the first electrode 261 may be connected to the source electrode 213 without being limited thereto.

Each of the TFTs 210 may include an active layer 211, a gate electrode 212, a source electrode 213, and a drain electrode 214. In FIG. 5, the TFTs 210 are exemplarily illustrated as being formed in a top gate type where the gate electrode 212 is disposed on the active layer 211, but embodiments provided herein are not limited thereto. In other embodiments, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of any semiconductor material, including a silicon-based semiconductor material or an oxide-based semiconductor material. A light blocking layer (not shown) for blocking external light incident on the active layer 211 may be formed between the buffer layer and the active layer 211.

A gate insulation layer 220 may be formed on the active layer 211. The gate insulation layer 220 may be formed of an inorganic layer, for example, silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which may include one of molybdenum (Mo), chromium (Cr), titanium (Ti), nickel (Ni), neodymium (Nd), and copper (Cu), or an alloy thereof. The gate electrode 212 may be connected to the gate line, such that the gate electrode 212 receives a signal provided on the gate line.

An interlayer dielectric 230 may be formed on the gate electrode 212 and the gate line. The interlayer dielectric 230 may be formed of an inorganic layer, for example, SiOx, SiNx, or a multilayer thereof.

The source electrode 213, the drain electrode 214, and a data line may be formed on the interlayer dielectric 230. The source electrode 213 may contact the active layer 211 through a second contact hole CT2 which passes through the gate insulation layer 220 and the interlayer dielectric 230. The drain electrode 214 may contact the active layer 211 through a first contact hole CT1 which passes through the gate insulation layer 220 and the interlayer dielectric 230. The source electrode 213, the drain electrode 214, and the data line may each be formed of a single layer or a multilayer which includes one of Mo, Cr, Ti, Ni, Nd, and Cu, or an alloy thereof. The data line may be connected to source electrode 213, such that a driving signal provided on the data line may be provided to the drain electrode 214 when the TFT is turned on by a gate signal provided at the gate electrode 212.

A passivation layer 240 for insulating the TFTs 210 may be formed on the source electrode 213, the drain electrode 214, and the data line. The passivation layer 240 may be formed of an inorganic layer, for example, SiOx, SiNx, or a multilayer thereof.

A first planarization layer 250 for planarizing a step height caused by the TFTs 210 may be formed on the passivation layer 240. The first planarization layer 250 may be formed of an organic layer such as acryl resin, epoxy resin, phenolic resin, polyamide resin, polyimide resin, or the like.

An organic light emitting device 260 and a bank 270 may be formed on the first planarization layer 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be formed on the first planarization layer 250. The first electrode 261 may pass through the passivation layer 240 and the first planarization layer 250 and may be connected to a side surface of the drain electrode 214 of the TFT 210 through a shared contact hole CTS. The shared contact hole CTS may be a hole which passes through the first planarization layer 250, the passivation layer 240, and extends at least partially into the interlayer dielectric 230. Accordingly, a portion of the interlayer dielectric 230 is sunken or recessed in the shared contact hole CTS. The shared contact hole CTS may be formed by simultaneously etching the first planarization layer 250, the passivation layer 240, the drain electrode 214, and the interlayer dielectric 230. Therefore, only the side surface of the drain electrode 214 of the TFT may be exposed by the shared contact hole CTS, and thus, the first electrode 261 may be connected to the exposed side surface of the drain electrode 214 of the TFT 210 through the shared contact hole CTS, as the first electrode 261 extends along the side surface of the shared contact hole CTS to contact the exposed side surface of the drain electrode 214. A process of forming the shared contact hole CTS will be described in further detail in an operation (S103) of FIG. 7.

Figure 6:
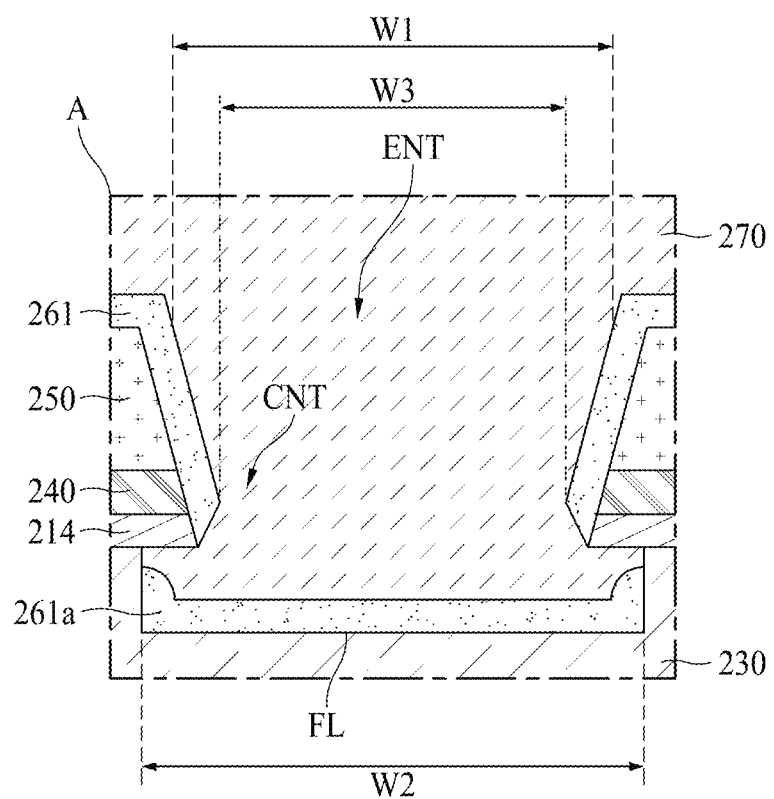
FIG. 6 is an enlarged cross-sectional view of an area A of FIG. 5.

The shared contact hole CTS, as shown in further detail in FIG. 6, may include an entrance ENT, a floor FL, and a contact region CNT. The first electrode 261 and the drain electrode 214 of the TFT 210 are connected to each other in the contact region CNT, which is positioned between the entrance ENT and the floor FL. In order for the first electrode 261 to be connected to the drain electrode 214 of the TFT 210, the shared contact hole CTS may be formed to have inclined sidewalls from the entrance ENT to the contact region CNT in a taper shape. A width W1 across the entrance ENT of the shared contact hole CTS may be wider than a width W3 of the contact region CNT. Additionally, the first electrode 261 of a pixel P should be disconnected in the shared contact hole CTS from a first electrode of a pixel P adjacent to the pixel P. Therefore, in order to form the first electrode 261 to be disconnected in the shared contact hole CTS from a first electrode of an adjacent pixel P, a width W2 of the floor FL of the shared contact hole CTS may be wider than the width W3 of the contact region CNT, which facilitates a disconnection of the first electrode 261 in the shared contact hole CTS. More particularly, the shared contact hole CTS may be formed to be inclined from the contact region CNT to the floor FL in a reverse taper shape or may be formed in any shape such that a lower surface of the drain electrode 214 of the TFT 210 may be exposed in the contact region CNT. For example, as shown in FIG. 5, the shared contact hole CTS may have an undercut shape where the interlayer dielectric 230 disposed under the drain electrode 214 of the TFT 210 is sunken in order for the lower surface of the drain electrode 214 of the TFT 210 to be exposed. This undercut provides space for accommodating some of the material that forms the first electrode 261, thereby disconnecting the first electrode 261 in the shared contact hole CTS.

The first electrode 261 may be formed through a sputtering process, an e-BEAM deposition process, an evaporation process, or the like. Even when the first electrode 261 is formed through the sputtering process, which is good in a step coverage characteristic, the shared contact hole CTS may be formed having a reverse taper shape between the contact region CNT and the floor FL or may be formed in any shape such that the lower surface of the drain electrode 214 of the TFT 210 may be exposed, and thus, the first electrode 261 may be formed to be disconnected in the shared contact hole CTS. The step coverage denotes that a layer deposited by a deposition process is continuously connected without being disconnected even in a portion where a step height is formed. However, as shown in FIG. 6, even a process of forming the first electrode 261 having good step coverage will result in a disconnect of the first electrode 261 between the contact region CNT and the floor FL, due to the reverse taper or undercut.

Moreover, since the shared contact hole CTS is formed in a reverse taper shape between the contact region CNT and the floor FL or may be formed in any shape such that the lower surface of the drain electrode 214 of the TFT 210 may be exposed, a dummy electrode 261a may be formed on the floor FL of the shared contact hole CTS so as to be disconnected from the first electrode 261. The dummy electrode 261a may contact a first portion of a side surface of the interlayer dielectric 230 in the contact hole CTS, as shown in FIG. 5. A second portion of the side surface of the interlayer dielectric 230 is not contacted by the dummy electrode 261a. The first electrode 261 and the dummy electrode 261a may be formed through the same process, and thus, may be formed of the same material. The dummy electrode 261a thus may be a portion of the material that forms the first electrode 261, but the dummy electrode 261a is disconnected from the first electrode 261. For example, the first electrode 261 and the dummy electrode 261a may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed to fill the shared contact hole CTS. The bank 270 may contact a second portion of the side surface of the interlayer dielectric 250 in the contact hole CTS. That is, the bank 270 may contact the side surface of the interlayer dielectric 250 between an upper surface of the dummy electrode 261a and a lower surface of the drain electrode 214. Also, the bank 270 may be formed on the first planarization layer 250 and may cover an edge of the first electrode 261. The bank 270 thus divides a plurality of emissive areas EA. That is, the bank 270 may define the emissive areas EA.

Each of the emissive areas EA may denote an area where the first electrode 261 corresponding to an anode electrode, the organic light emitting layer 262, and the second electrode 263 corresponding to a cathode electrode are sequentially stacked, and a hole from the first electrode 261 and an electron from the second electrode 263 are combined in the organic light emitting layer to emit light. In this case, an area where the bank 270 is provided does not emit light, and thus, may be defined as a non-emissive area.

The bank 270 may be formed of an organic layer such as acryl resin, epoxy resin, phenolic resin, polyamide resin, polyimide resin, or the like.

The organic light emitting layer 262 may be formed on the first electrode 261 and the bank 270. The organic light emitting layer 262 may be a common layer which is formed in each of the pixels P in common, and may be a white light emitting layer that emits white light. In this case, the organic light emitting layer 262 may be formed in a tandem structure of two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with an alkali metal, such as lithium (Li), sodium (Na), potassium (K), or cesium (Cs), or an alkali earth metal such as magnesium (Mg), strontium (Sr), barium (Ba), or radium (Ra). The p-type charge generating layer may be an organic layer which is formed by doping an organic host material with a dopant having an ability to transport holes.

In FIG. 5, it is illustrated that the organic light emitting layer 262 is a common layer which is formed in each of the pixels P in common and is the white light emitting layer emitting the white light, but the present embodiments are not limited thereto. In other embodiments, a respective organic light emitting layer 262 may be individually provided in each of the pixels P, and in this case, the pixels P may be divided into red pixels including a red light emitting layer emitting red light, green pixels including a green light emitting layer emitting green light, and blue pixels including a blue light emitting layer emitting blue light.

The second electrode 263 may be formed on the organic light emitting layer 262. The second electrode 263 may be a common layer which is formed in each of the pixels P in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. In a case where the second electrode 263 is formed of the semi-transmissive conductive material, emission efficiency may be enhanced by a micro-cavity. A capping layer may be formed on the second electrode 263.

An encapsulation layer 280 may be formed on the second electrode 263. The encapsulation layer 280 prevents oxygen or water from penetrating into the organic light emitting layer 262 and the second electrode 263. The encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, or the like. Also, the encapsulation layer 280 may further include at least one organic layer, for preventing particles from penetrating into the organic light emitting layer 262 and the second electrode 263 via the encapsulation layer 280.

A plurality of color filters 301 and 302 and a black matrix 310 may be disposed on the second substrate 112 and positioned between the second substrate 112 and the encapsulation layer 280. The color filters 301 and 302 may be respectively disposed in correspondence with the pixels P. The black matrix 310 may be disposed between and partially overlapping the adjacent color filters 301 and 302 and may be disposed in correspondence with the bank 270.

The color filters 301 and 302 on the second substrate 112 may be adhered to the encapsulation layer 280 on the first substrate 111 by an adhesive layer 290. Therefore, the first substrate 111 and the structures formed thereon may be bonded to the second substrate 112 and the structures formed thereon. The adhesive layer 290 may be a transparent adhesive film, a transparent adhesive resin, or the like. The second substrate 112 may be a plastic film, a glass substrate, an encapsulation film (a protective film), or the like.

As described above, in an embodiment of the present disclosure, since the shared contact hole CTS is formed having a reverse taper shape between the contact region CNT and the floor FL or may be formed in any shape such that the lower surface of the drain electrode 214 of the TFT 210 may be exposed, the first electrode 261 may be disconnected in the shared contact hole CTS. As a result, in an embodiment of the present disclosure, the first electrode 261 of the organic light emitting device 260 of each of adjacent pixels P may be electrically connected to the respective drain electrode 214 of the respective TFT 210 through the shared contact hole CTS, without being short-circuited to one another. Therefore, in an embodiment of the present disclosure, N number of pixels may share the shared contact hole CTS for connecting the first electrode of the organic light emitting device to the drain electrode of the TFT. Accordingly, in an embodiment of the present disclosure, an emissive area is prevented from being reduced by the shared contact hole CTS, thereby preventing a lifetime of an organic light emitting layer from being shortened due to the reduction in the emissive area EA.

Figure 7:
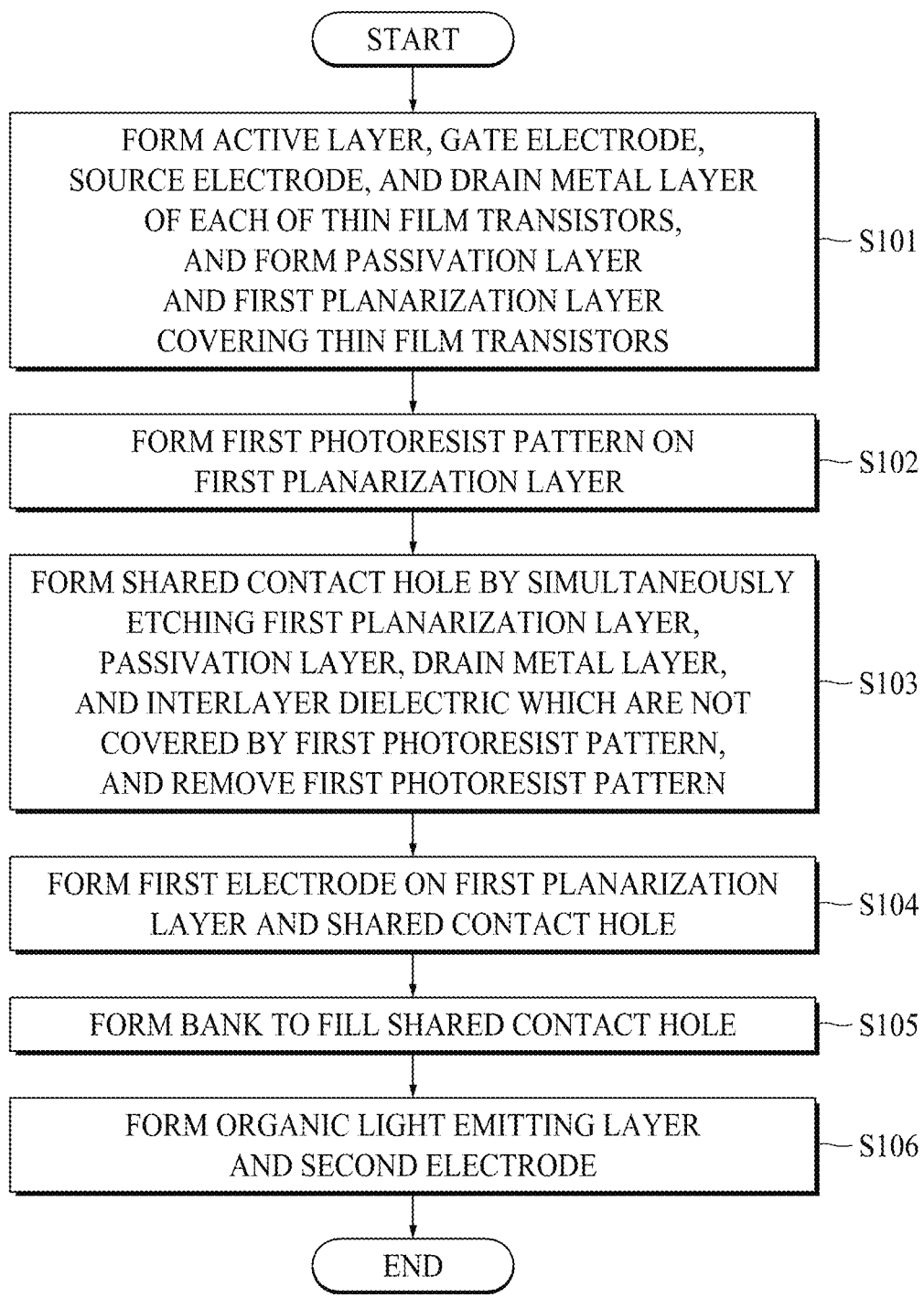
FIG. 7 is a flowchart illustrating a method of manufacturing an organic light emitting display device according to one or more embodiments of the present disclosure.

FIG. 7 is a flowchart illustrating a method of manufacturing an organic light emitting display device according to an embodiment of the present disclosure. FIGS. 8A to 8F are cross-sectional views taken along line I-I' for describing the method of manufacturing an organic light emitting display device according to an embodiment of the present disclosure.

The cross-sectional views illustrated in FIGS. 8A to 8F relate to the method of manufacturing the organic light emitting display device illustrated in FIG. 5, and thus, like reference numerals refer to like elements. Hereinafter, a method of manufacturing an organic light emitting display device according to an embodiment of the present disclosure will be described in detail with reference to FIGS. 7 and 8A to 8F.

Figure 8A:
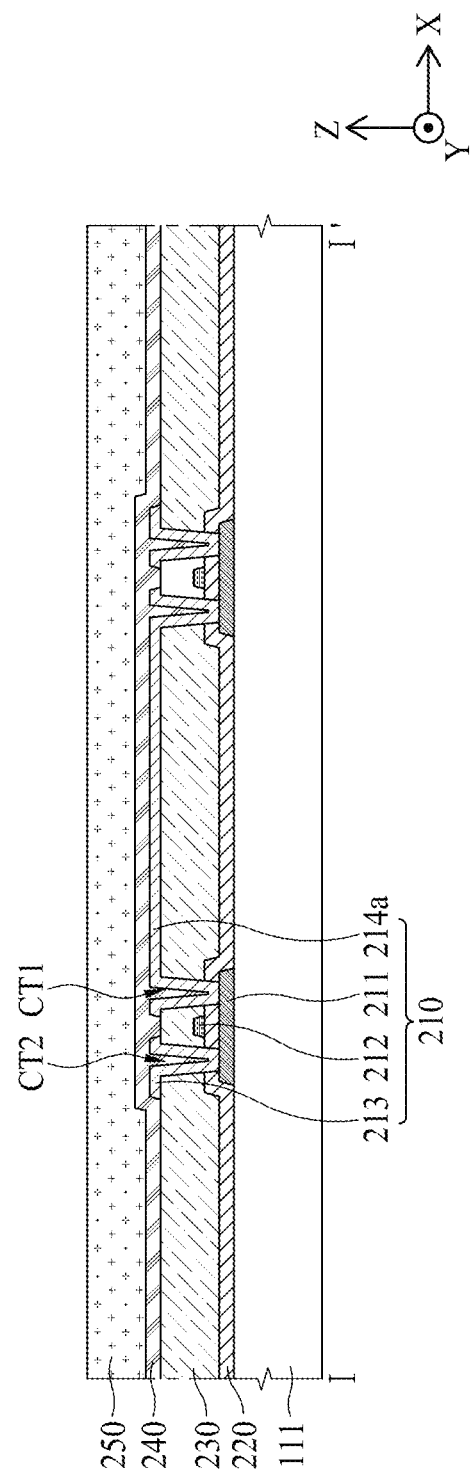

At S101, with reference to FIG. 8A, an active layer 211, a gate electrode 212, a source electrode 213, and a drain metal layer 214a which are included in each of a plurality of TFTs 210 may be formed, and a passivation layer 240 and a first planarization layer 250 which cover the TFTs 210 may be formed.

In detail, before the TFTs 210 are formed, a buffer layer may be formed on a first substrate 111, for protecting the TFTs 210 from water penetrating through the substrate 111. The buffer layer may include a plurality of inorganic layers which are alternately stacked, for protecting the TFTs 210 and an organic light emitting device 260 from water which penetrates through the first substrate 111, which may be vulnerable to penetration of water. For example, the buffer layer may be formed of a multilayer where one or more inorganic layers of silicon oxide (SiOx), silicon nitride (SiNx), and SiON are alternately stacked. The buffer layer may be formed by using a chemical vapor deposition (CVD) process.

Subsequently, the active layer 211 of each of the TFTs 210 may be formed on the buffer layer. In detail, an active metal layer may be formed all over the buffer layer by using a sputtering process, a metal organic chemical vapor (MOCVD) process, or the like. Subsequently, the active layer 211 may be formed by patterning the active metal layer through a mask process using a photoresist pattern. The active layer 211 may be formed of a silicon-based semiconductor material, an oxide-based semiconductor material, or the like.

Subsequently, a gate insulation layer 220 may be formed on the active layer 211. The gate insulation layer 220 may be formed of an inorganic layer, for example, silicon oxide (SiOx), silicon nitride (SiNx), or a multilayer thereof.

Subsequently, the gate electrode 212 of each of the TFTs 210 may be formed on the gate insulation layer 220. In detail, a first metal layer may be formed all over the gate insulation layer 220 by using a sputtering process, an MOCVD process, or the like. Subsequently, the gate electrode 212 may be formed by patterning the first metal layer through a mask process using a photoresist pattern. The gate electrode 212 may be formed of a single layer or a multilayer which includes one of molybdenum (Mo), chromium (Cr), titanium (Ti), nickel (Ni), neodymium (Nd), and copper (Cu), or an alloy thereof.

Subsequently, an interlayer dielectric 230 may be formed on the gate electrode 212. The interlayer dielectric 230 may be formed of an inorganic layer, for example, SiOx, SiNx, or a multilayer thereof.

Subsequently, a plurality of contact holes CT1, CT2 which pass through the gate insulation layer 220 and the interlayer dielectric 230 to expose the active layer 211 may be formed.

Subsequently, the source electrode 213 and the drain metal layer 214a of each of the TFTs 210 may be formed on the interlayer dielectric 230. In detail, a second metal layer may be formed all over the interlayer dielectric 230 and into the contact holes CT1, CT2 by using a sputtering process, an MOCVD process, or the like. Subsequently, the source electrode 213 and the drain metal layer 214a may be formed by patterning the second metal layer through a mask process using a photoresist pattern. The source electrode 213 may contact one side of the active layer 211 through a second contact hole CT2 which passes through the gate insulation layer 220 and the interlayer dielectric 230. The drain metal layer 214a may contact the other side of the active layer 211 through a first contact hole CT1 which passes through the gate insulation layer 220 and the interlayer dielectric 230. The source electrode 213 and the drain metal layer 214a may each be formed of a single layer or a multilayer which includes one of Mo, Cr, Ti, Ni, Nd, and Cu, or an alloy thereof. Also, as shown in FIG. 8A, the drain metal layers 214a of adjacent pixels P may be connected to each other.

Subsequently, a passivation layer 240 may be formed on the source electrode 213 and the drain metal layer 214a of each of the TFTs 210, and on the interlayer dielectric 230. The passivation layer 240 may be formed of an inorganic layer, for example, SiOx, SiNx, or a multilayer thereof. The passivation layer 240 may be formed by using a CVD process.

Subsequently, a first planarization layer 250 for planarizing a step height caused by the TFTs 210 may be formed on the passivation layer 240. The first planarization layer 250 may be formed of an organic layer such as acryl resin, epoxy resin, phenolic resin, polyamide resin, polyimide resin, or the like.

At S102, with reference to FIG. 8B, a first photoresist pattern PR1 may be formed on the first planarization layer 250. The first photoresist pattern PR1 may be formed in an area other than an area where a shared contact hole CTS is to be formed.

Figure 8C:
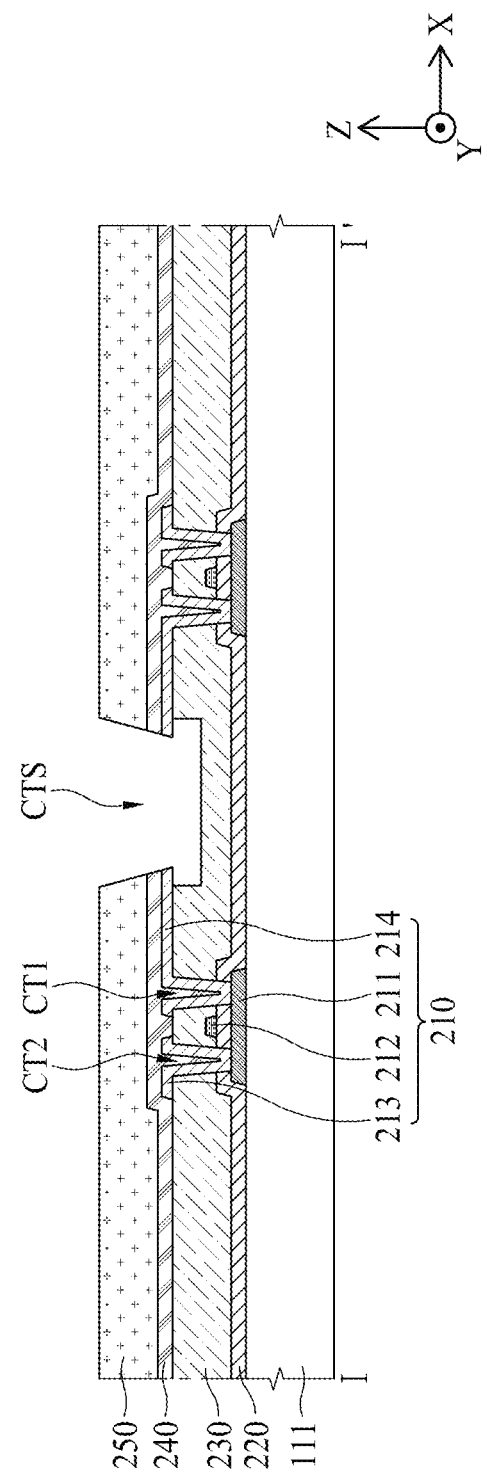

At S103, with reference to FIG. 8C, a shared contact hole CTS may be formed by simultaneously etching the first planarization layer 250, the passivation layer 240, the drain metal layer 214a, and the interlayer dielectric 230 which are not covered by the first photoresist pattern PR1, and then, the first photoresist pattern PR1 may be removed.

The shared contact hole CTS may be a hole which passes through the first planarization layer 250, the passivation layer 240, and the drain metal layer 214a and extends at least partially into the interlayer dielectric 230. The shared contact hole CTS thus forms a sunken or recessed portion of the interlayer dielectric 230. Since the shared contact hole CTS is formed by simultaneously etching the first planarization layer 250, the passivation layer 240, the drain metal layer 214a, and the interlayer dielectric 230, a pattern of the drain electrode 214 may be finished, with a side surface of the drain electrode 214 of the TFT 210 being exposed by the shared contact hole CTS.

The shared contact hole CTS may include an entrance ENT, a floor FL, and a contact region CNT which is formed by exposing the side surface of the drain electrode 214 of the TFT 210 between the entrance ENT and the floor FL. In order for the first electrode 261 to be connected to the drain electrode 214 of the TFT 210, the shared contact hole CTS may be formed to be inclined from the entrance ENT to the contact region CNT in a taper shape, and particularly, a width W1 of the entrance ENT may be wider than a width W3 of the contact region CNT. Additionally, the first electrode 261 of a pixel P should be disconnected in the shared contact hole CTS, otherwise the first electrode 261 would be connected to a first electrode of a pixel P adjacent to the pixel P. Therefore, in order for the first electrode 261 to be disconnected in the shared contact hole CTS, a width W2 of the floor FL of the shared contact hole CTS may be wider than the width W3 of the contact region CNT. The shared contact hole CTS may be formed to be inclined from the contact region CNT to the floor FL in a reverse taper shape or may be formed in any shape such that a lower surface of the drain electrode 214 of the TFT 210 may be exposed in the contact region CNT. For example, as shown in FIG. 8C, the shared contact hole CTS may have an undercut shape where the interlayer dielectric 230 disposed under the drain electrode 214 of the TFT 210 is sunken in order for the lower surface of the drain electrode 214 of the TFT 210 to be exposed.

The shared contact hole CTS may be formed by using a dry etching process. First, the drain metal layer 214a may be exposed by etching the first planarization layer 250 and the passivation layer 240 with a first etch gas. In this case, the first etch gas may be a gas which etches the first planarization layer 250 and the passivation layer 240 but does not etch a metal layer such as the drain metal layer 214a. Subsequently, the drain electrode 214 may be formed by etching through the exposed drain metal layer 214a with a second etch gas. In this case, the second etch gas may be a gas which etches a metal layer such as the drain metal layer 214a but does not etch the interlayer dielectric 230. Subsequently, the shared contact hole CTS may be finished by etching the interlayer dielectric 230 with a third etch gas to form the undercut and recessed or sunken portion. The third etch gas may be oxygen ($O_2$) or a mixed gas of oxygen ($O_2$) and $CF_4$, for forming the shared contact hole CTS in a shape such that a lower surface of the drain electrode 214 of the TFT 210 may be exposed.

Figure 8D:
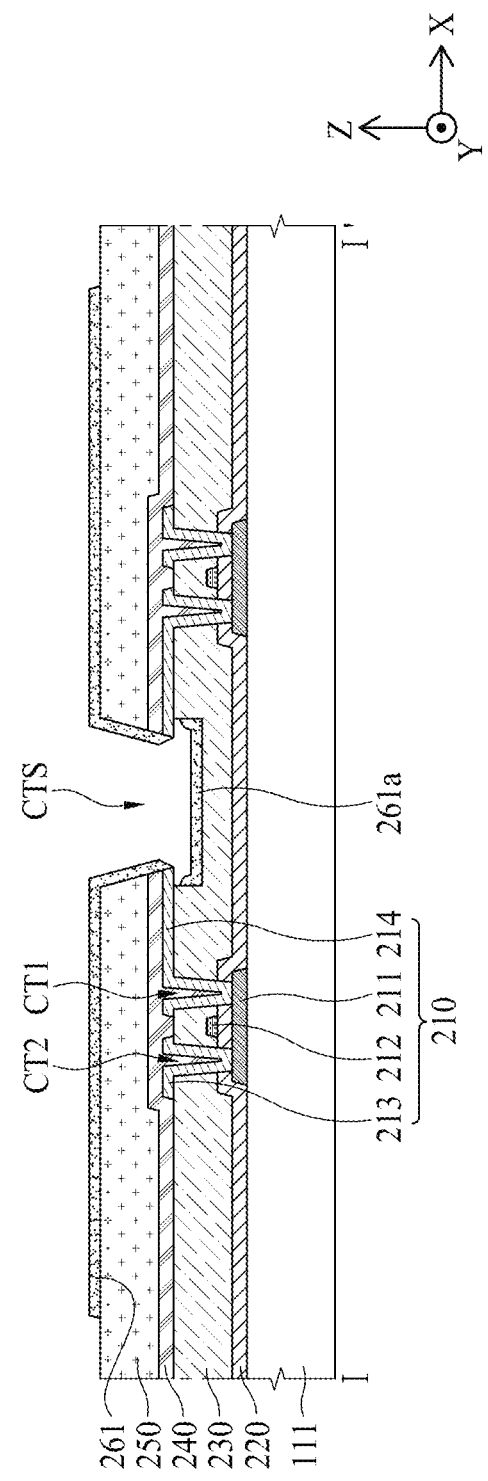

At S104, with reference to FIG. 8D, a first electrode 261 may be formed on the first planarization layer 250 and on the inclined side surface of the shared contact hole CTS.

In detail, a third metal layer may be formed all over the first planarization layer 250 by using a sputtering process, an MOCVD process, an e-BEAM deposition process, an evaporation process, or the like. Subsequently, the first electrode 261 may be formed by patterning the third metal layer through a mask process using a photoresist pattern.

The first electrode 261 may be connected to the side surface of the drain electrode 214 of the TFT 210 exposed through the shared contact hole CTS. Since the first electrode 261 is connected to only the side surface of the drain electrode 214 of the TFT 210, a contact resistance of the first electrode 261 and the drain electrode 214 may be high. Therefore, in order to lower the contact resistance of the first electrode 261 and the drain electrode 214, a thickness of the first electrode 261 and a thickness of the drain electrode 214 may be chosen to be thick enough to provide a suitable contact resistance. The thickness of the first electrode 261 and the thickness of the drain electrode 214 may be selected based on the contact resistance of the first electrode 261 and the drain electrode 214, which may be suitably determined through a previous experiment.

Even when the first electrode 261 is formed through the sputtering process, which is good in a step coverage characteristic, the shared contact hole CTS may be formed having a reverse taper shape between the contact region CNT and the floor FL or may be formed in any shape such that the lower surface of the drain electrode 214 of the TFT 210 may be exposed, and thus, the first electrode 261 may be disconnected in the shared contact hole CTS. The step coverage denotes that a layer deposited by a deposition process is continuously connected without being disconnected even in a portion where a step height is formed.

Moreover, a dummy electrode 261a may be formed on the floor FL of the shared contact hole CTS so as to be disconnected from the first electrode 261. The first electrode 261 and the dummy electrode 261a may be formed through the same process, and thus, may be formed of the same material. That is, the dummy electrode 261a may be a portion of the third metal layer that is formed on the floor FL of in the shared contact hole CTS, but is disconnected from the first electrode 261 due to the reverse taper or undercut. For example, the first electrode 261 and the dummy electrode 261a may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

Figure 8E:
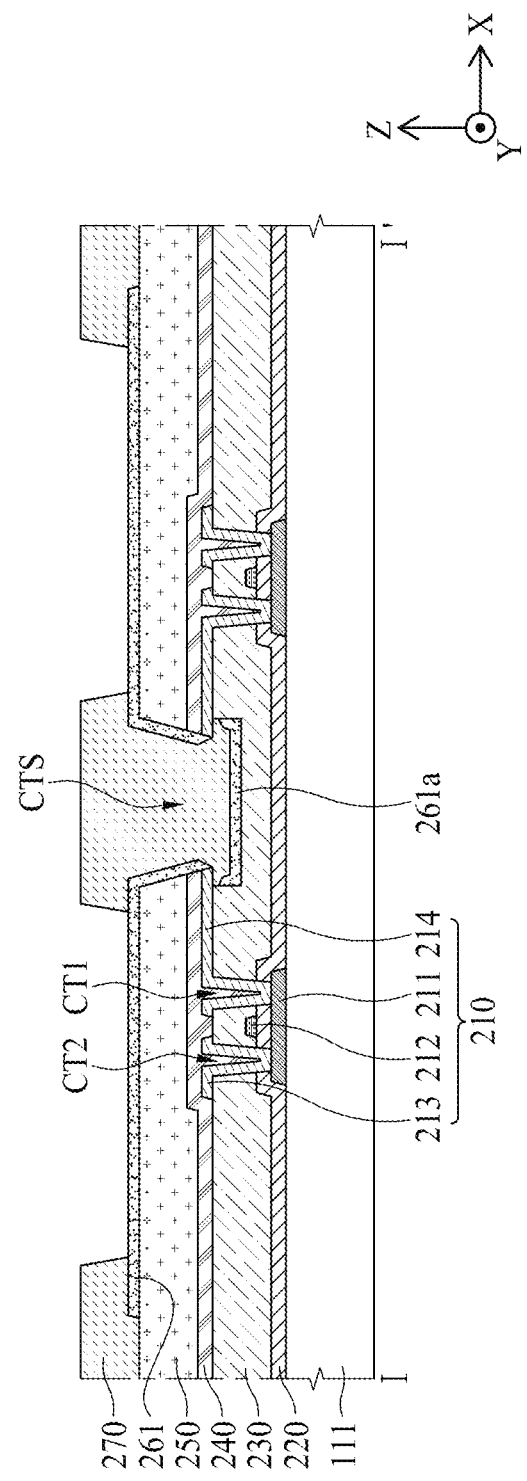

At S105, with reference to FIG. 8E, a bank 270 may be formed to fill the shared contact hole CTS.

The bank 270 may fill the shared contact hole CTS in order for the organic light emitting layer 262 to be uniformly deposited. Also, the bank 270 may be formed on the first planarization layer 250 to cover an edge of the first electrode 261, and to divide a plurality of emissive areas EA. That is, the bank 270 may define the emissive areas EA.

The bank 270 may be formed of an organic layer such as acryl resin, epoxy resin, phenolic resin, polyamide resin, polyimide resin, or the like.

Figure 8F:
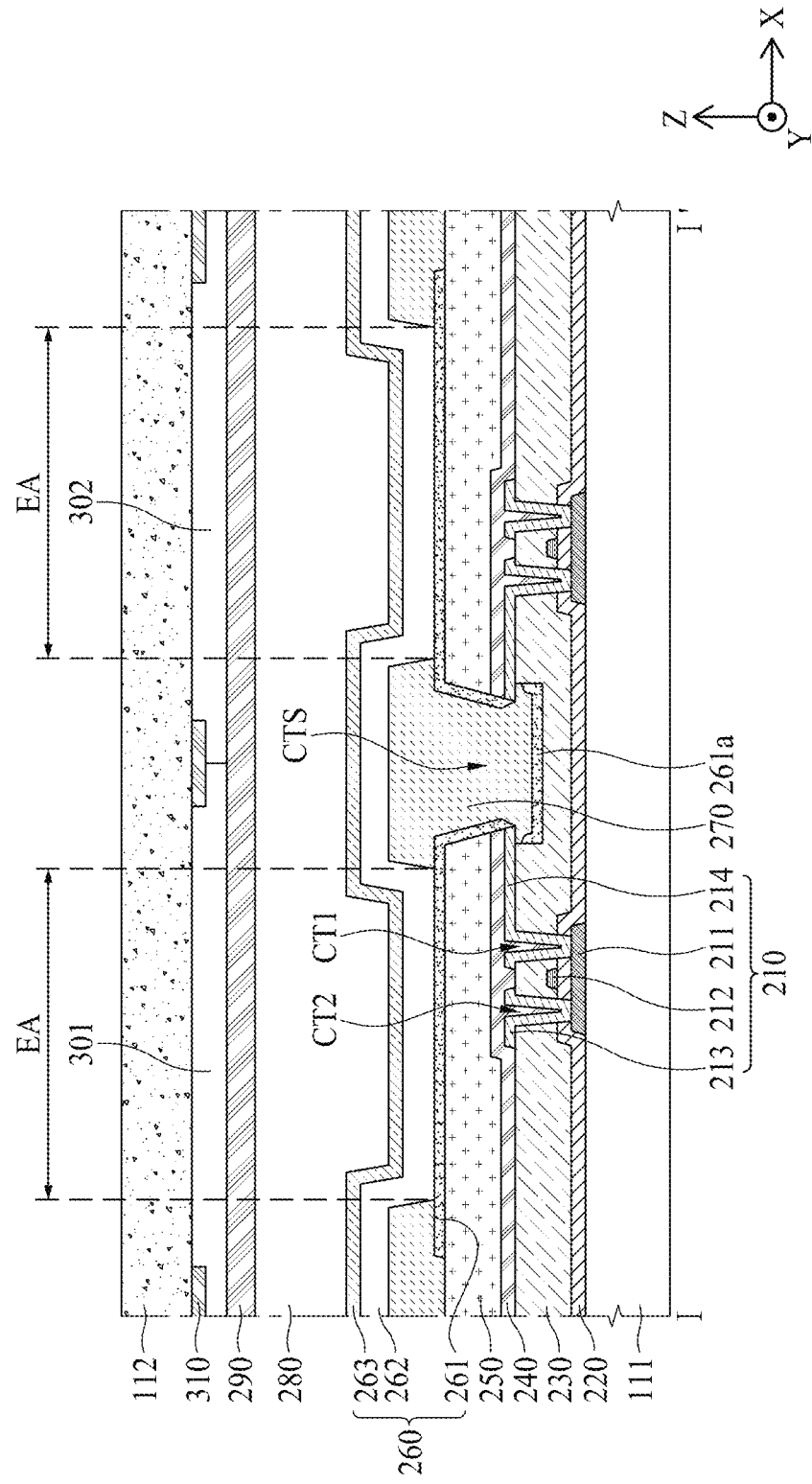

At S106, with reference to FIG. 8F, an organic light emitting layer 262 and a second electrode 263 may be formed on the first electrode 261 and the bank 270.

In detail, the organic light emitting layer 262 may be formed on the first electrode 261 and the bank 270 through a deposition process or a solution process. The organic light emitting layer 262 may be a common layer which is formed in each of the pixels P in common. In this case, the organic light emitting layer 262 may be a white light emitting layer that emits white light.

If the organic light emitting layer 262 is the white light emitting layer, the organic light emitting layer 262 may be formed in a tandem structure of two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with an alkali metal, such as lithium (Li), sodium (Na), potassium (K), or cesium (Cs), or an alkali earth metal such as magnesium (Mg), strontium (Sr), barium (Ba), or radium (Ra). The p-type charge generating layer may be an organic layer which is formed by doping an organic material with a dopant having an ability to transport holes.

Subsequently, a second electrode 263 may be formed on the organic light emitting layer 262. The second electrode 263 may be a common layer which is formed in each of the pixels P in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. In a case where the second electrode 263 is formed of the semi-transmissive conductive material, emission efficiency may be enhanced by a micro-cavity. The second electrode 263 may be formed through a physical vapor deposition (PVD) process such as a sputtering process. A capping layer may be formed on the second electrode 263.

Subsequently, an encapsulation layer 280 may be formed on the second electrode 263. The encapsulation layer 280 prevents oxygen or water from penetrating into the organic light emitting layer 262 and the second electrode 263. The encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, or the like.

Also, the encapsulation layer 280 may further include at least one organic layer. The organic layer may be formed to have a sufficient thickness for preventing particles from penetrating into the organic light emitting layer 262 and the second electrode 263 via the encapsulation layer 280.

Subsequently, the second substrate 112 where a plurality of color filters 301 and 302 and a black matrix 310 are provided may be bonded to the first substrate 111. The color filters 301 and 302 on the second substrate 112 may be adhered to the encapsulation layer 280 on the first substrate 111 by an adhesive layer 290. The adhesive layer 290 may be a transparent adhesive film, a transparent adhesive resin, or the like.

As described above, according to an embodiment of the present disclosure, the shared contact hole CTS may be formed by simultaneously etching the first planarization layer 250, the passivation layer 240, the drain metal layer 214a, and the interlayer dielectric 230. Therefore, in an embodiment of the present disclosure, the side surface of the drain electrode 214 of the TFT 210 may be exposed by the shared contact hole CTS. As a result, in an embodiment of the present disclosure, a size of the drain electrode 214 of the TFT 210 is prevented from being formed less than that of a contact hole, thereby preventing the first electrode 261 from being disconnected in a side surface of the source or drain electrode due to a step height between a floor of the contact hole and the drain electrode 214. Accordingly, in an embodiment of the present disclosure, a turn-on defect where a pixel does not emit light is prevented from occurring.

Figure 9:
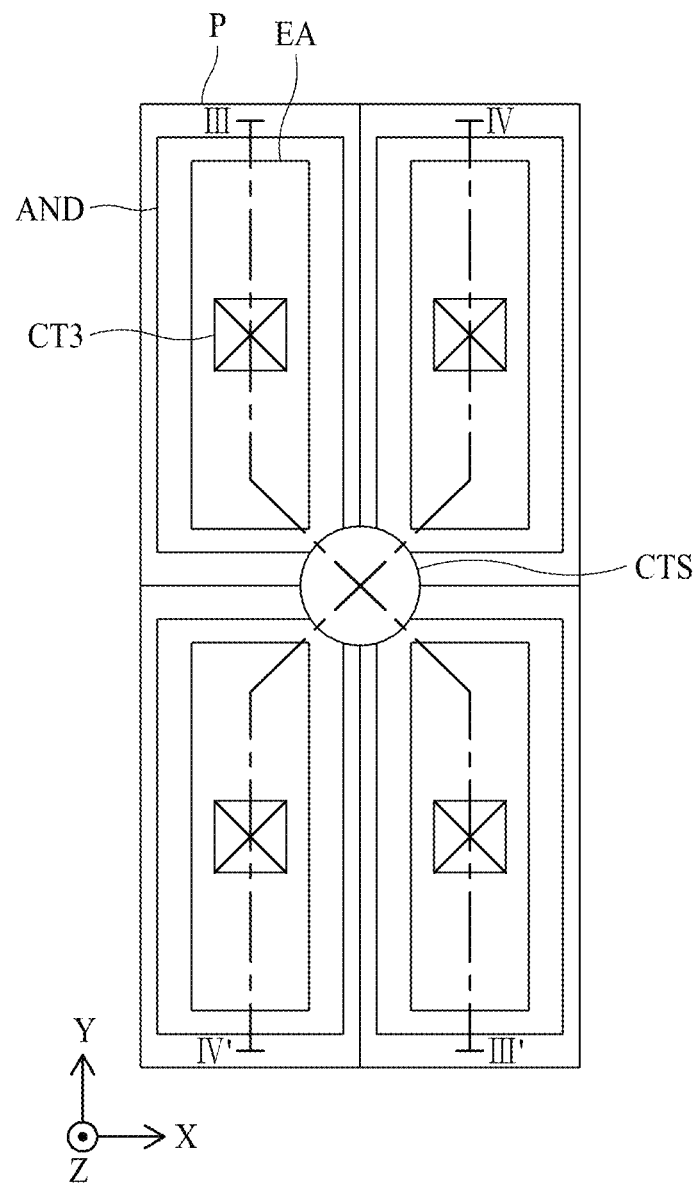
FIG. 9 is a plan view illustrating in detail another example of pixels in a display area, in accordance with one or more embodiments of the present disclosure.

FIG. 9 is a plan view illustrating in detail another example of pixels in a display area.

In FIG. 9, for convenience of description, only a pixel P, a first electrode AND, an emissive area EA, an auxiliary contact hole CT3, and a shared contact hole CTS are illustrated.

Referring to FIG. 9, a plurality of pixels P may be provided, and each of the pixels P may include at least one TFT and an organic light emitting device.

The TFT may include an active layer, a gate electrode overlapping the active layer, a source electrode connected to one side of the active layer, and a drain electrode connected to the other side of the active layer.

The organic light emitting device may include the first electrode AND corresponding to an anode electrode, an organic light emitting layer, and a second electrode corresponding to a cathode electrode. The emissive area EA may denote an area where the first electrode AND, the organic light emitting layer, and the second electrode are sequentially stacked, and a hole from the first electrode AND and an electron from the second electrode are combined in the organic light emitting layer to emit light. The emissive area EA of adjacent pixels P may be separated by a bank, and thus, the bank may correspond to a non-emissive area that does not emit light.

The auxiliary contact hole CT3 may be a contact hole which is formed for connecting the drain electrode of the TFT to the auxiliary electrode. Therefore, the drain electrode of the TFT may be connected to the auxiliary electrode through the auxiliary contact hole CT3.

The shared contact hole CTS may be a hole that exposes the auxiliary electrode that is connected to a respective drain electrode of each of N (where N is an integer equal to or more than two) number of pixels P. That is, the auxiliary electrodes of the N pixels P may be exposed through the shared contact hole CTS. The first electrode of the organic light emitting device of each of the N pixels P may be connected to the auxiliary electrode by the shared contact hole CTS. That is, the first electrode of the organic light emitting device of each of the N pixels P may be electrically connected to the drain electrode of the TFT through the auxiliary electrode.

Figure 13B:
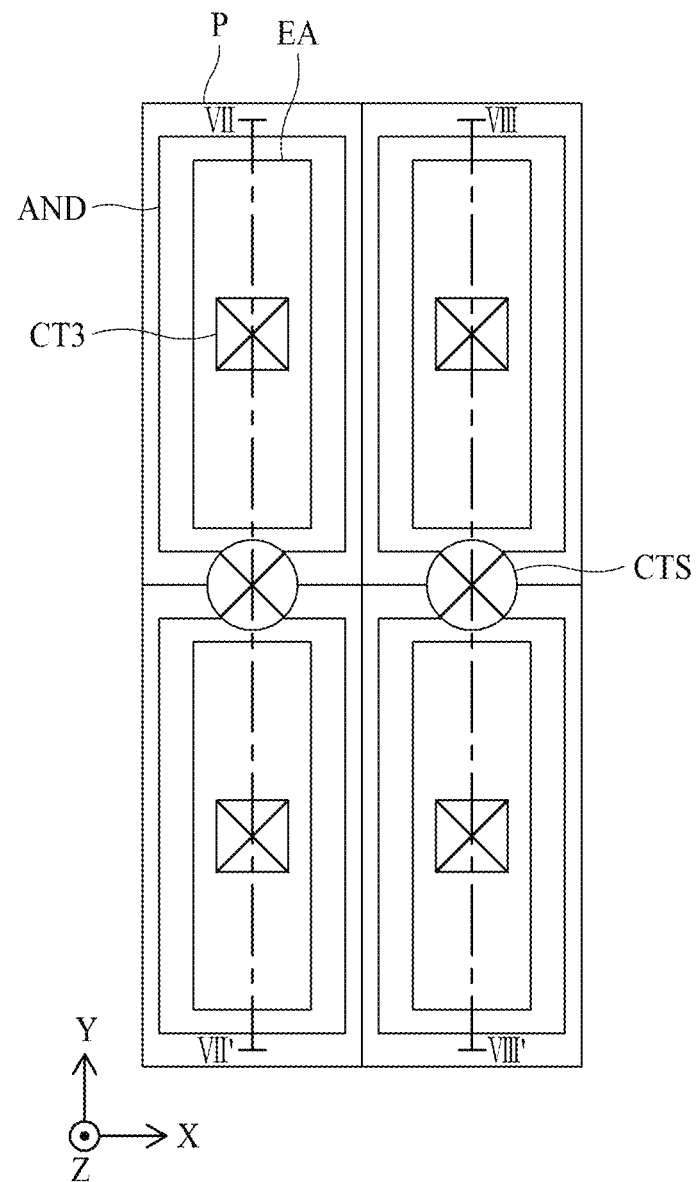
Figure 14B:
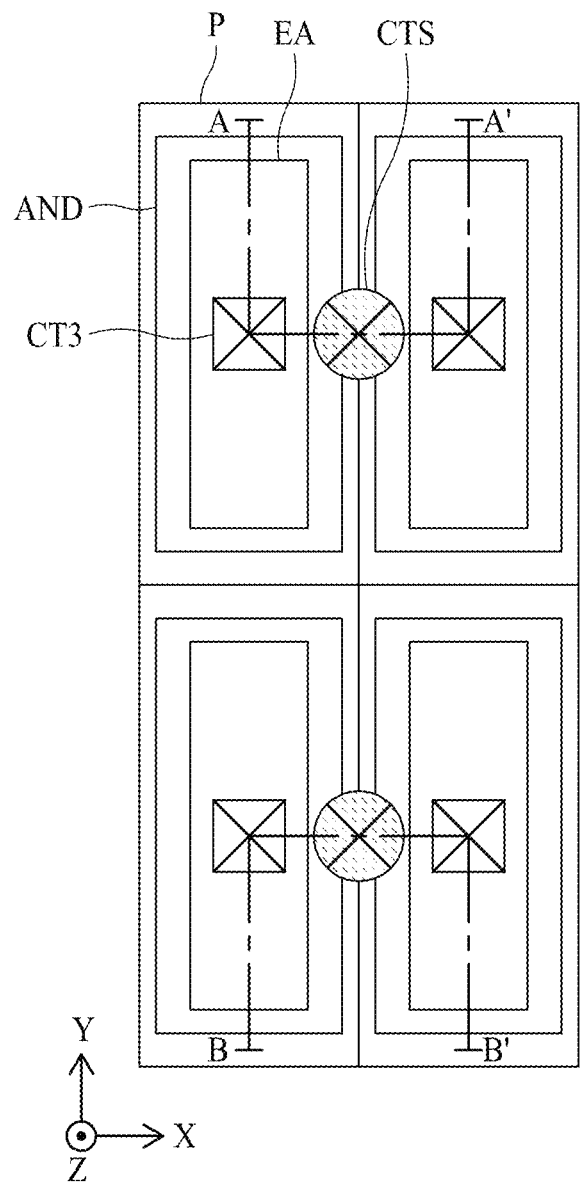
Figure 15B:
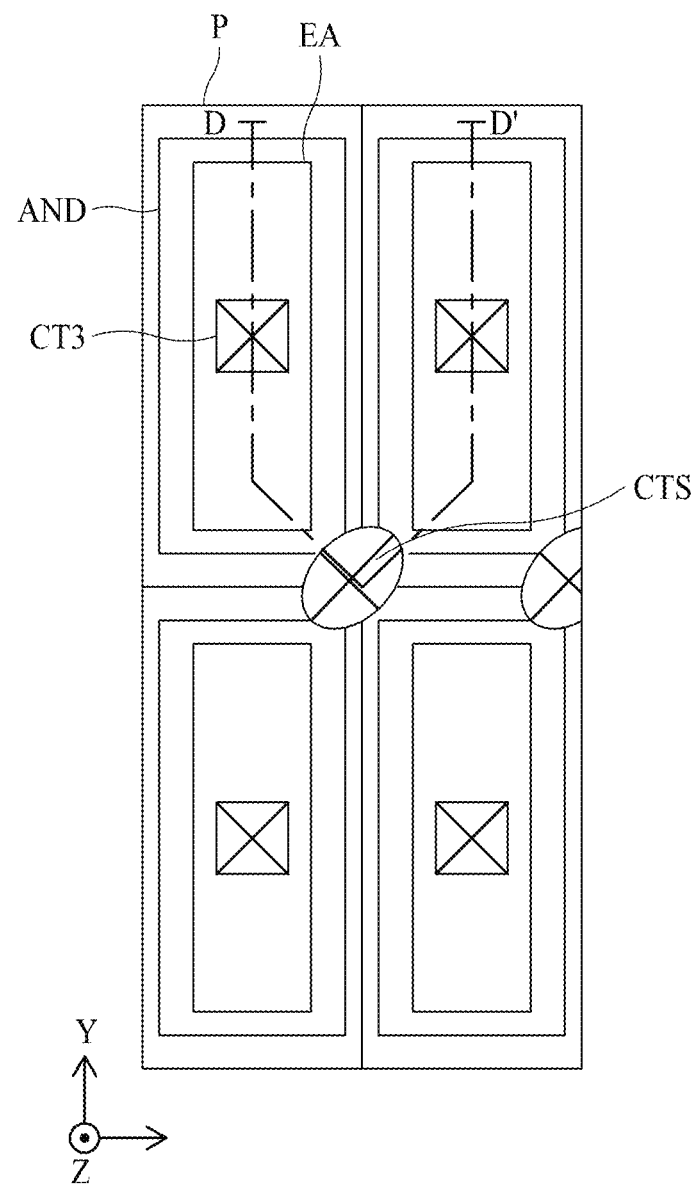

The N pixels P, as in FIG. 9, may share the shared contact hole CTS. In FIG. 9, N is illustrated as four (N=4), but the present embodiments are not limited thereto. For example, as shown in FIGS. 13B and 14B, N may be two (N=2), and as shown in FIG. 15A, N may be three (N=3). Even when N=2, as in FIG. 13B, pixels P which are adjacent to each other in a first direction (e.g., a Y axis direction) may share the shared contact hole CTS, and as in FIG. 14B, pixels P which are adjacent to each other in a second direction (e.g., an X axis direction) intersecting the first direction (e.g., the Y axis direction) may share the shared contact hole CTS. Also, when N=3, as in FIG. 15B, pixels P which are adjacent to each other in a triangular shape may share the shared contact hole CTS.

As described above, in an embodiment of the present disclosure, the N pixels P may share the shared contact hole CTS for electrically connecting the first electrode of the organic light emitting device to the drain electrode of the TFT. Accordingly, in an embodiment of the present disclosure, the emissive area EA is prevented from being reduced by a contact hole, thereby preventing a lifetime of the organic light emitting layer from being shortened due to the reduction in the emissive area EA.

In FIG. 9, for convenience of description, the auxiliary electrode is described as being connected to the drain electrode of the TFT through the auxiliary contact hole CT3, but the present embodiments are not limited thereto. In other embodiments, the auxiliary electrode may be connected to the source electrode of the TFT through the auxiliary contact hole CT3.

Figure 10:
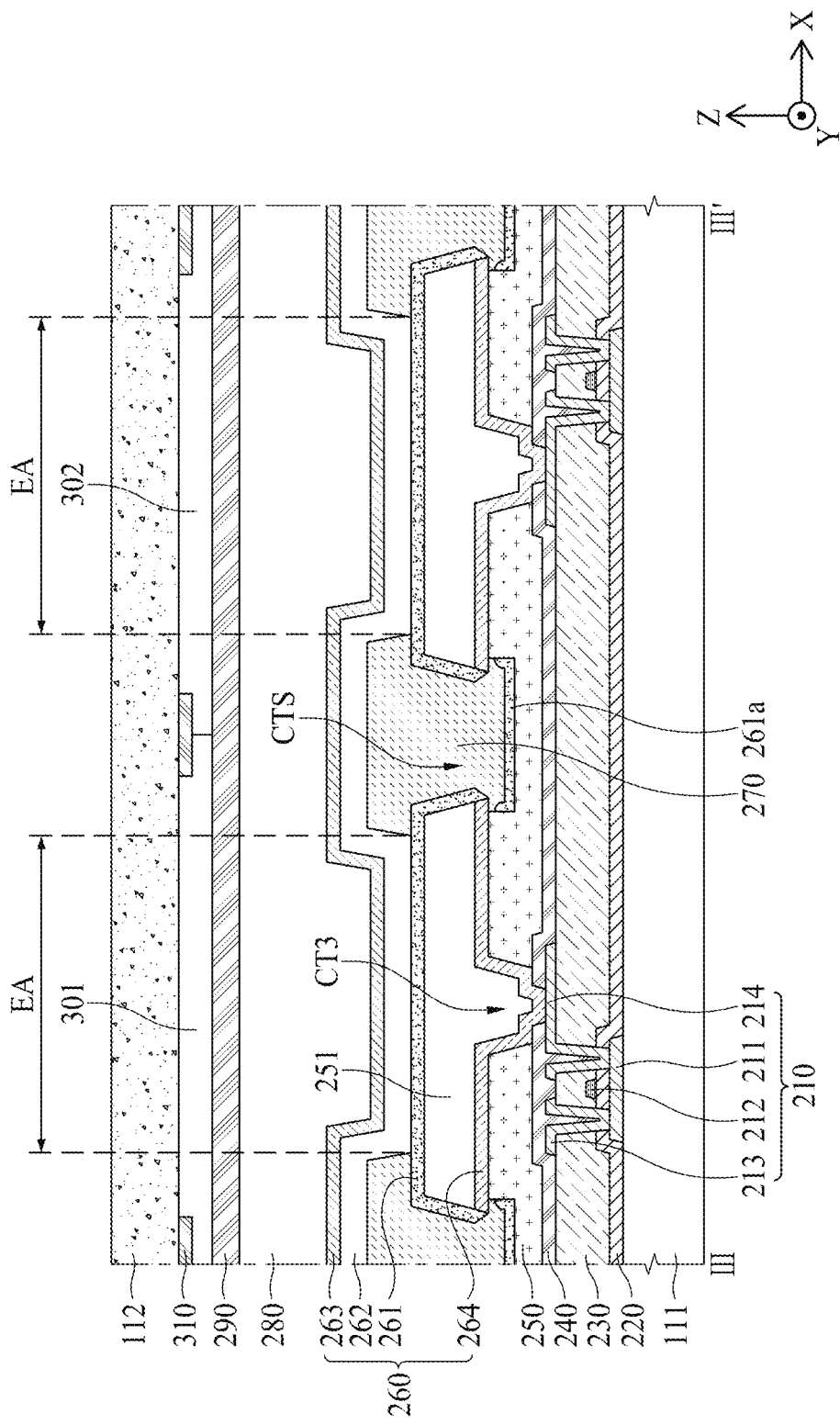
FIG. 10 is a cross-sectional view taken along line III-III' of FIG. 9.

FIG. 10 is a cross-sectional view illustrating another example taken along line III-III' of FIG. 9.

Except that an auxiliary electrode 264 and a second planarization layer 251 are additionally formed and the auxiliary electrode 264 instead of a source electrode 213 or a drain electrode 214 of a TFT 210 is exposed through a shared contact hole CTS, the cross-sectional view illustrated in FIG. 10 is substantially as described above with reference to FIG. 5. Therefore, detailed descriptions of first and second substrates 111 and 112, an active layer 211, a gate electrode 212, a source electrode 213, and a drain electrode 214 of a TFT 210, a gate insulation layer 220, an interlayer dielectric 230, a passivation layer 240, a first planarization layer 250, an organic light emitting layer 262, a second electrode 263, an encapsulation layer 280, an adhesive layer 290, color filters 301 and 302, and a black matrix 310 illustrated in FIG. 10 are omitted.

Referring to FIG. 10, an auxiliary contact hole CT3 which passes through the passivation layer 240 and the first planarization layer 250 to expose the drain electrode 214 of the TFT 210 may be formed. An auxiliary electrode 264 may be formed on the first planarization layer 250 and in the auxiliary contact hole CT3 and may be connected to the drain electrode 214 of the TFT 210 through the auxiliary contact hole CT3.

The auxiliary electrode 264 may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

A second planarization layer 251 may be formed on the auxiliary electrode 264 and in the auxiliary contact hole CT3. The second planarization layer 251 may be formed to fill the auxiliary contact hole CT3. The second passivation layer 251 may be formed of an organic layer such as acryl resin, epoxy resin, phenolic resin, polyamide resin, polyimide resin, or the like.

The first electrode 261 may be formed on the second planarization layer 251. The first electrode 261 may pass through the second planarization layer 251 and may be connected to a side surface of the auxiliary electrode 264 through a shared contact hole CTS. The shared contact hole CTS may be a hole which passes through the second planarization layer 251 and extends at least partially into the first planarization layer 250. Accordingly, a portion of the first planarization layer 250 is sunken or recessed in the shared contact hole CTS. The shared contact hole CTS may be formed by simultaneously etching the second planarization layer 251, the auxiliary electrode 264, and the first planarization layer 251. Therefore, only the side surface of the auxiliary electrode 264 may be exposed by the shared contact hole CTS, and thus, the first electrode 261 may be connected to the side surface of the auxiliary electrode 264 through the shared contact hole CTS. A process of forming the shared contact hole CTS will be described in further detail in an operation (S205) of FIG. 11.

The first electrode 261 may be connected to only the side surface of the auxiliary electrode 264, thereby increasing a contact resistance of the first electrode 261 and the auxiliary electrode 264. Therefore, in order to lower the contact resistance of the first electrode 261 and the auxiliary electrode 264, a thickness of the first electrode 261 and a thickness of the auxiliary electrode 264 may be increased to provide a suitable contact resistance. The thickness of the first electrode 261 and the thickness of the auxiliary electrode 264 may be selected based on the contact resistance of the first electrode 261 and the auxiliary electrode 264 which may be suitably determined through a previous experiment.

The shared contact hole CTS, as in the embodiment shown in FIG. 6, may include an entrance ENT, a floor FL, and a contact region CNT through which the first electrode 261 and the auxiliary electrode 264 are connected to each other between the entrance ENT and the floor FL. In order for the first electrode 261 to be connected to the auxiliary electrode 264, the shared contact hole CTS may be formed to have inclined sidewalls from the entrance ENT to the contact region CNT in a taper shape, and particularly, a width W1 of the the entrance ENT may be wider than a width W3 of the contact region CNT. Also, the first electrode 261 of a pixel P should be disconnected in the shared contact hole CTS from a first electrode of a pixel P adjacent to the pixel P. Therefore, in order for the first electrode 261 to be disconnected in the shared contact hole CTS, a width W2 of the floor FL of the shared contact hole CTS may be wider than the width W3 of the contact region CNT, and more particularly, the shared contact hole CTS may be formed to be inclined from the contact region CNT to the floor FL in a reverse taper shape or may be formed in any shape such that a lower surface of the auxiliary electrode 264 may be exposed in the contact region CNT. For example, as in FIG. 10, the shared contact hole CTS may have an undercut shape where the first planarization layer 250 disposed under the auxiliary electrode 264 is sunken in order for the lower surface of the auxiliary electrode 264 to be exposed.

The first electrode 261 may be formed through a sputtering process, an MOCVD process, an e-BEAM deposition process, an evaporation process, or the like. Even when the first electrode 261 is formed through the sputtering process which is good in a step coverage characteristic, the shared contact hole CTS may be formed having a reverse taper shape between the contact region CNT and the floor FL or may be formed in any shape such that the lower surface of the auxiliary electrode 264 may be exposed, and thus, the first electrode 261 may be disconnected in the shared contact hole CTS.

Moreover, a dummy electrode 261a may be formed on the floor FL of the shared contact hole CTS so as to be disconnected from the first electrode 261. The first electrode 261 and the dummy electrode 261a may be formed through the same process, and thus, may be formed of the same material. For example, the first electrode 261 and the dummy electrode 261a may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed to fill the shared contact hole CTS. Also, the bank 270 may be formed on the second planarization layer 251 to cover an edge of the first electrode 261, and dividing a plurality of emissive areas EA. That is, the bank 270 may define the emissive areas EA.

As described above, in an embodiment of the present disclosure, since the shared contact hole CTS is formed in a reverse taper shape between the contact region CNT and the floor FL or may be formed in any shape such that the lower surface of the auxiliary electrode 264 may be exposed, the auxiliary electrode 264 may be disconnected in the shared contact hole CTS. As a result, in an embodiment of the present disclosure, the first electrode 261 of the organic light emitting device 260 of each of adjacent pixels P may be electrically connected to the auxiliary electrode 264 through the shared contact hole CTS. The first electrode 261 is thus connected to the drain electrode 214 of the TFT 210 via the auxiliary electrode 264. Therefore, in an embodiment of the present disclosure, N number of pixels may share the shared contact hole CTS for connecting the first electrode of the organic light emitting device to the auxiliary electrode 264, and thus to the drain electrode of the TFT. Accordingly, in an embodiment of the present disclosure, an emissive area is prevented from being reduced by the shared contact hole CTS, thereby preventing a lifetime of an organic light emitting layer from being shortened due to the reduction in the emissive area EA.

Figure 11:
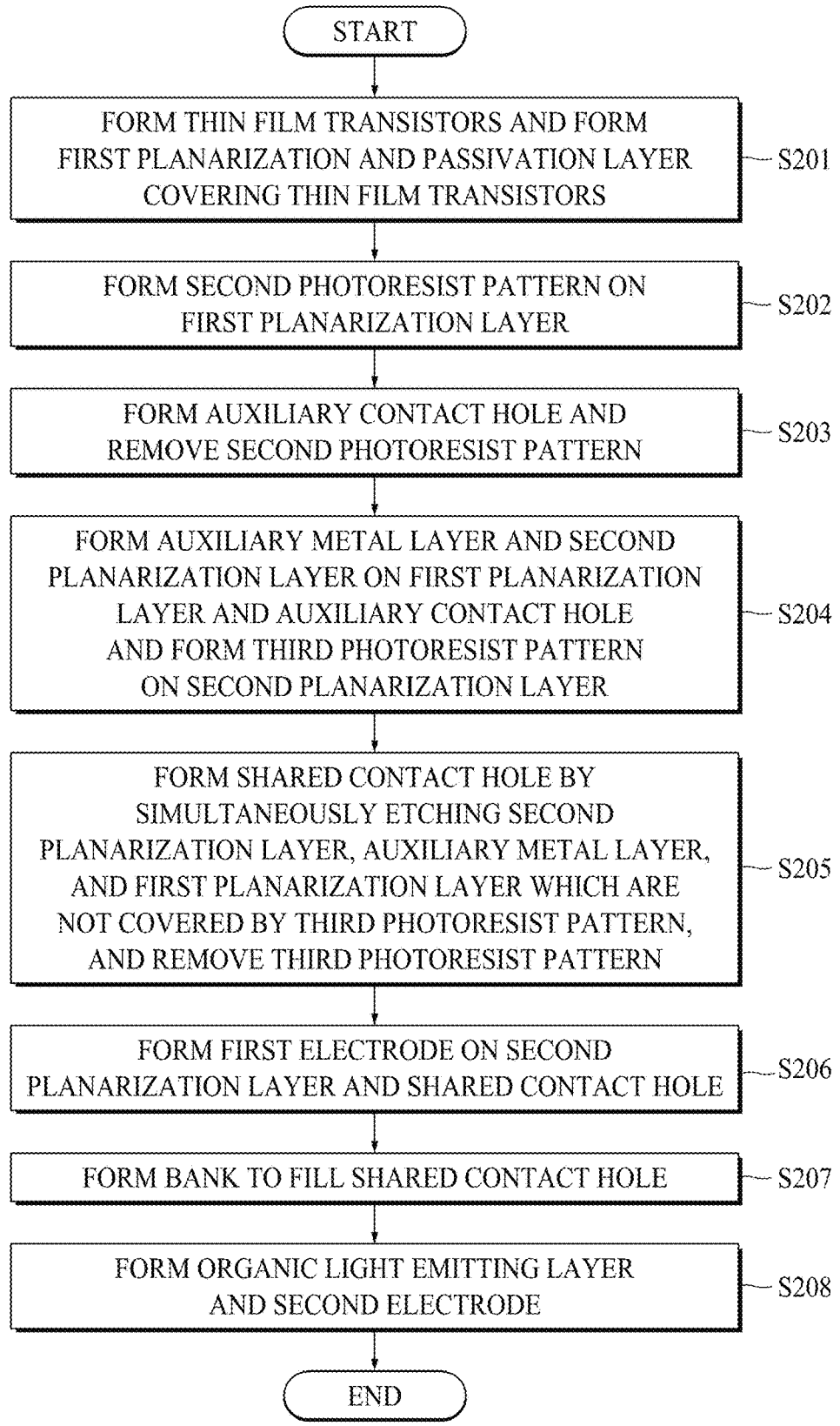
FIG. 11 is a flowchart illustrating a method of manufacturing an organic light emitting display device according to one or more embodiments of the present disclosure.

FIG. 11 is a flowchart illustrating a method of manufacturing an organic light emitting display device according to an embodiment of the present disclosure. FIGS. 12A to 12H are cross-sectional views taken along line III-III' for describing a method of manufacturing an organic light emitting display device according to an embodiment of the present disclosure.

The cross-sectional views illustrated in FIGS. 12A to 12H relate to the method of manufacturing the organic light emitting display device illustrated in FIG. 10, and thus, like reference numerals refer to like elements. Hereinafter, a method of manufacturing an organic light emitting display device according to an embodiment of the present disclosure will be described in detail with reference to FIGS. 11 and 12A to 12H.

Figure 12A:
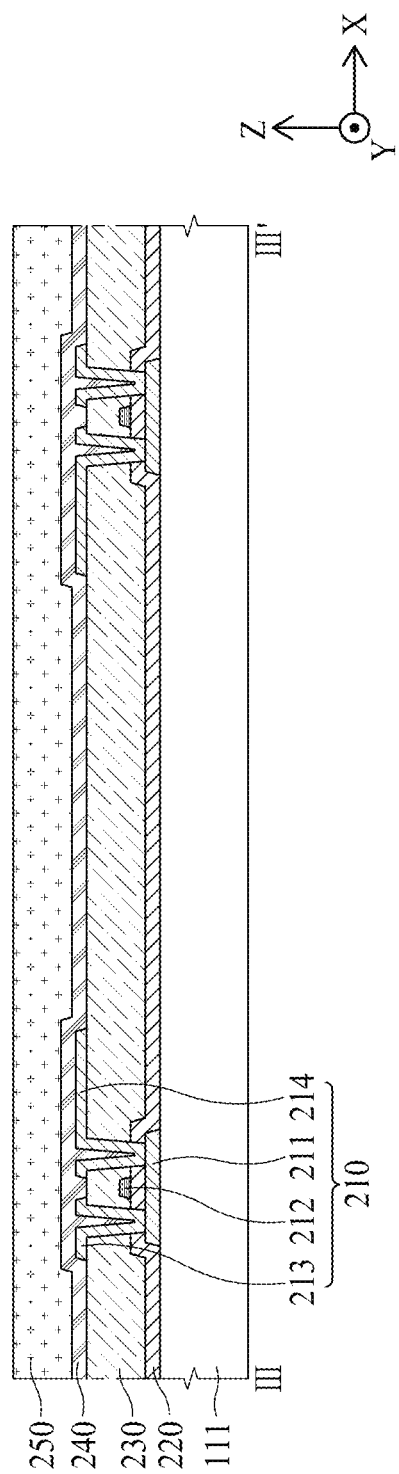
FIGS. 12A to 12H are cross-sectional views taken along line III-III' for describing the method of manufacturing an organic light emitting display device of FIG. 11, according to embodiments of the present disclosure.

At S201, with reference to FIG. 12A, an active layer 211, a gate electrode 212, a source electrode 213, and a drain electrode 214 which are included in each of a plurality of TFTs 210 may be formed, and a passivation layer 240 and a first planarization layer 250 which cover the TFTs 210 may be formed.

A method of forming the active layer 211 and the gate electrode 212 of each of the TFTs 210, the gate insulation layer 220, and the interlayer dielectric 230 is substantially the same as the operation (S101) of FIG. 7 described above with reference to FIG. 8A.

The source electrode 213 and the drain electrode 214 of each of the TFTs 210 may be formed on the interlayer dielectric 230. In detail, a second metal layer may be formed all over the interlayer dielectric 230 by using a sputtering process, an MOCVD process, or the like. Subsequently, the source electrode 213 and the drain electrode 214 may be formed by patterning the second metal layer through a mask process using a photoresist pattern. The source electrode 213 may contact one side of the active layer 211 through a second contact hole which passes through the gate insulation layer 220 and the interlayer dielectric 230. The drain electrode 214 may contact the other side of the active layer 211 through a first contact hole which passes through the gate insulation layer 220 and the interlayer dielectric 230. The source electrode 213 and the drain electrode 214 may each be formed of a single layer or a multilayer which includes one of Mo, Cr, Ti, Ni, Nd, and Cu, or an alloy thereof.

Subsequently, a passivation layer 240 may be formed on the source electrode 213 and the drain electrode 214 of each of the TFTs 210, and on the interlayer dielectric 230. The passivation layer 240 may be formed of an inorganic layer, for example, SiOx, SiNx, or a multilayer thereof. The passivation layer 240 may be formed by using a CVD process.

Subsequently, a first planarization layer 250 for planarizing a step height caused by the TFTs 210 may be formed on the passivation layer 240. The first planarization layer 250 may be formed of an organic layer such as acryl resin, epoxy resin, phenolic resin, polyamide resin, polyimide resin, or the like.

Figure 12B:
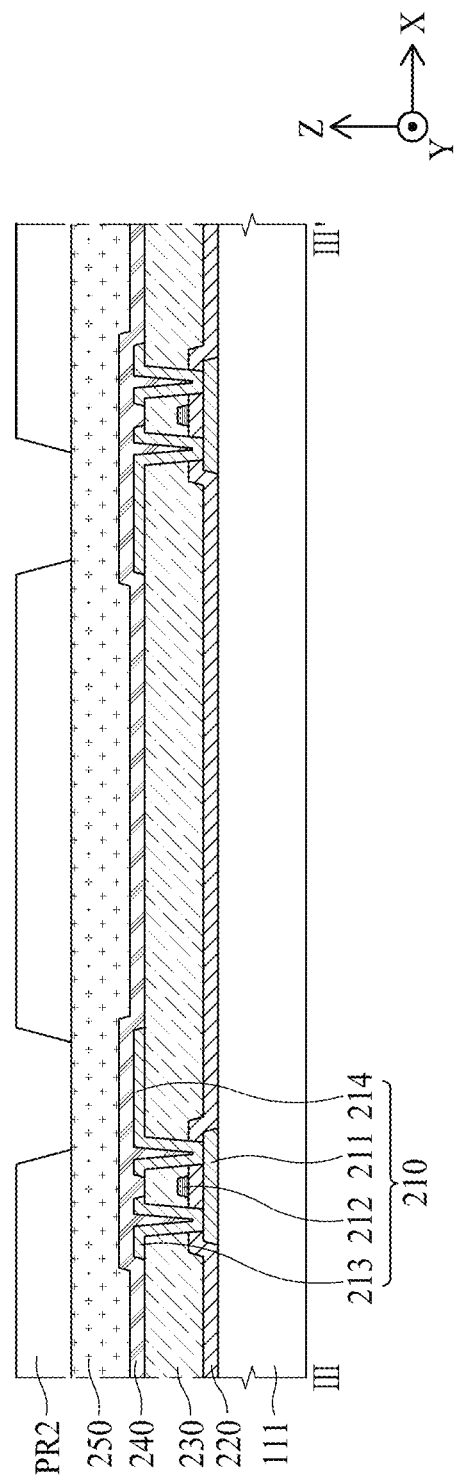

At S202, with reference to FIG. 12B, a second photoresist pattern PR2 may be formed on the first planarization layer 250. The second photoresist pattern PR2 may be formed in an area other than an area where an auxiliary contact hole CT3 is to be formed.

Figure 12C:
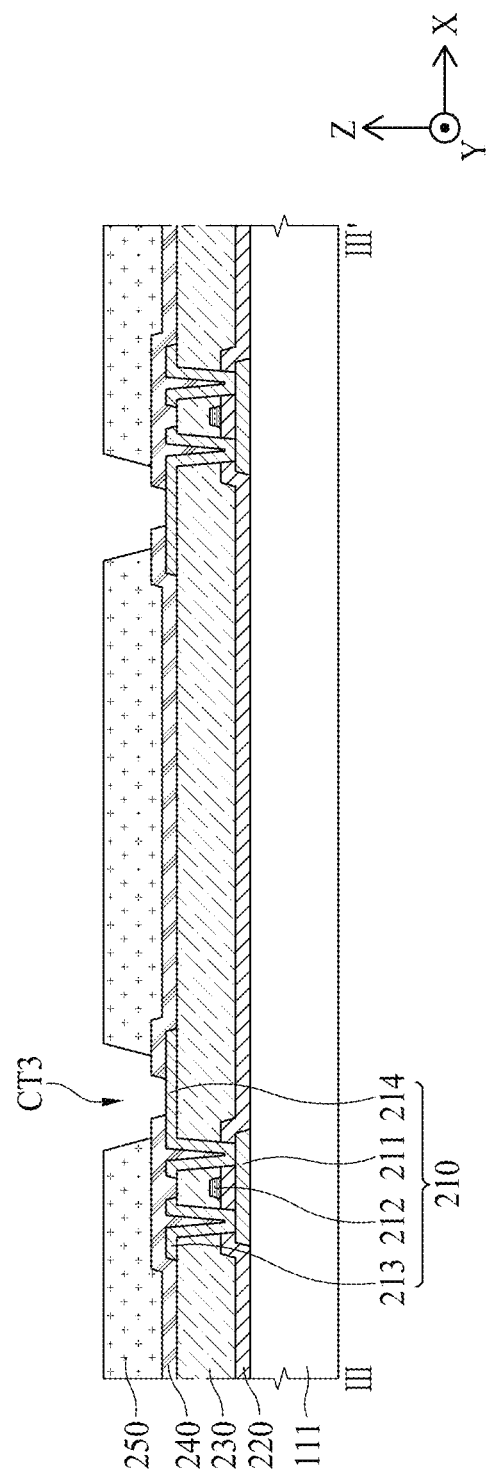

At S203, with reference to FIG. 12C, an auxiliary contact hole CT3 which exposes the drain electrode 214 of each of the TFTs 210 may be formed by etching the first planarization layer 250 which is not covered by the second photoresist pattern PR2, and then, the second photoresist pattern PR2 may be removed.

Figure 12D:
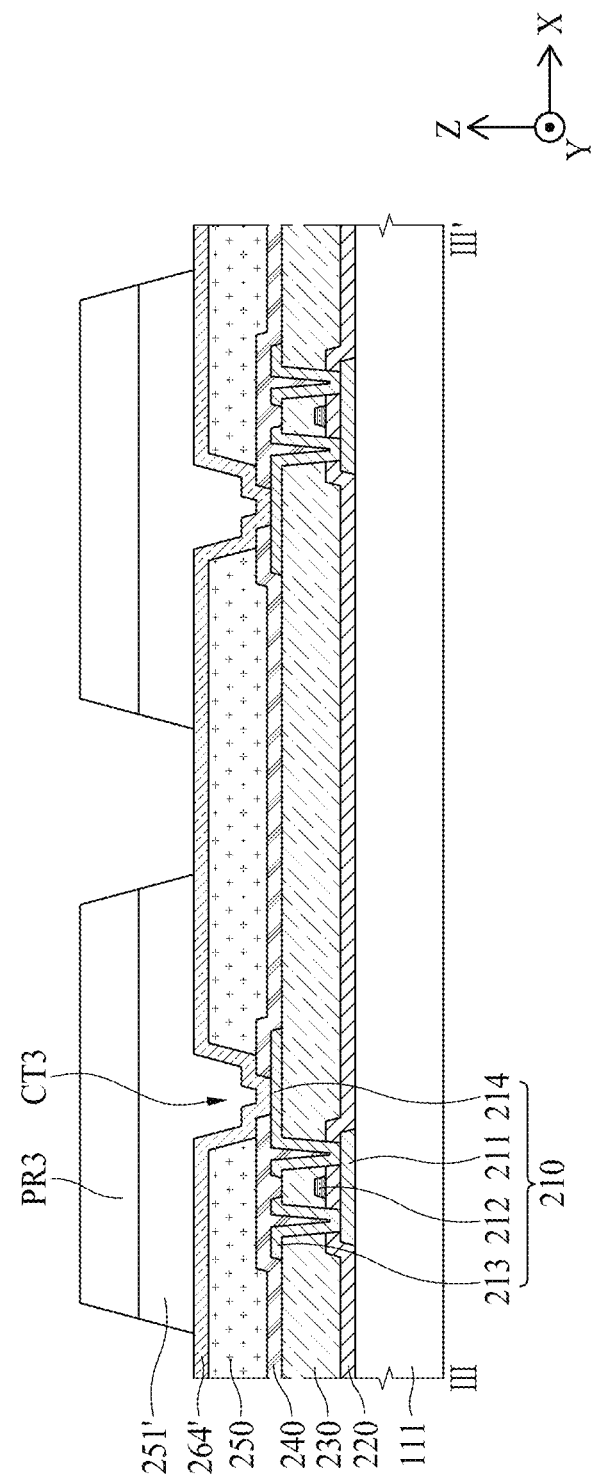

At S204, with reference to FIG. 12D, an auxiliary metal layer 264' may be formed on the first planarization layer 250 and in the auxiliary contact hole CT3. The auxiliary metal layer 264' may be connected to the exposed drain electrode 214 of each of the TFTs 210 in the auxiliary contact hole CT3.

The auxiliary metal layer 264' may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

Subsequently, a second planarization layer 251 may be formed on the auxiliary metal layer 264'. The second passivation layer 251 may be formed of an organic layer such as acryl resin, epoxy resin, phenolic resin, polyamide resin, polyimide resin, or the like.

Subsequently, a third photoresist pattern PR3 may be formed on the second planarization layer 251. The third photoresist pattern PR3 may be formed in an area other than an area where the shared contact hole CTS is to be formed.

Figure 12E:
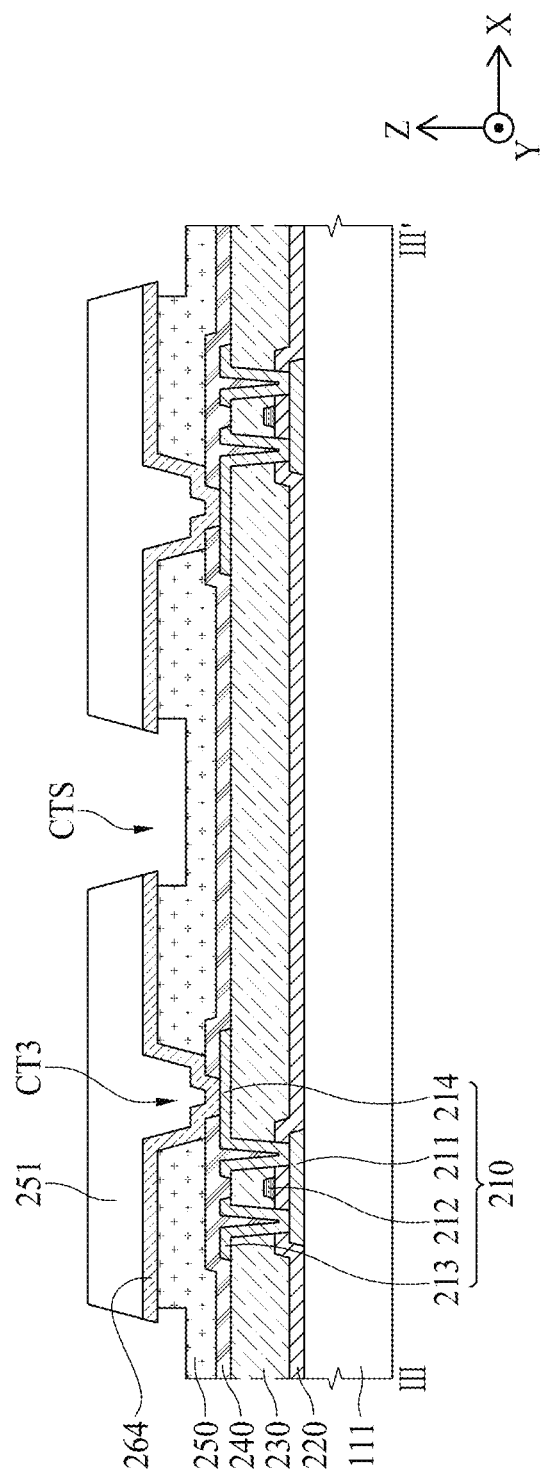

At S205, with reference to FIG. 12E, the shared contact hole CTS may be formed by simultaneously etching the second planarization layer 251, the auxiliary metal layer 264', and the first planarization layer 250 which are not covered by the third photoresist pattern PR3, and then, the third photoresist pattern PR3 may be removed.

The shared contact hole CTS may be a hole which passes through the second planarization layer 251 and the auxiliary metal layer 264' and extends at least partially into the first planarization layer 250. The shared contact hole CTS thus forms a sunken or recessed portion of the first planarization layer 250. Since the shared contact hole CTS is formed by simultaneously etching the second planarization layer 251, the auxiliary metal layer 264', and the first planarization layer 250, a pattern of the auxiliary electrode 264 may be finished, with a side surface of the auxiliary electrode 264 being exposed by the shared contact hole CTS.

The shared contact hole CTS may include an entrance ENT, a floor FL, and a contact region CNT which is formed by exposing the side surface of the auxiliary electrode 264 between the entrance ENT and the floor FL. In order for the first electrode 261 to be connected to the auxiliary electrode 264, the shared contact hole CTS may be formed to be inclined from the entrance ENT to the contact region CNT in a taper shape, and particularly, a width W1 of the entrance ENT may be wider than a width W3 of the contact region CNT. Additionally, the first electrode 261 of a pixel P should be disconnected in the shared contact hole CTS, otherwise the first electrode 261 would be connected to a first electrode of a pixel P adjacent to the pixel P. Therefore, in order for the first electrode 261 to be disconnected in the shared contact hole CTS, a width W2 of the floor FL of the shared contact hole CTS may be wider than the width W3 of the contact region CNT, and particularly, the shared contact hole CTS may be formed to be inclined from the contact region CNT to the floor FL in a reverse taper shape or may be formed in any shape such that a lower surface of the auxiliary electrode 264 may be exposed in the contact region CNT. For example, as shown in FIG. 12E, the shared contact hole CTS may have an undercut shape where the first planarization layer 250 disposed under the auxiliary electrode 264 is sunken in order for the lower surface of the auxiliary electrode 264 to be exposed.

The shared contact hole CTS may be formed by using a dry etching process. First, the auxiliary metal layer 264' may be exposed by etching the second planarization layer 251 with a first etch gas. In this case, the first etch gas may be a gas which etches the second planarization layer 251 but does not etch a metal layer such as the auxiliary metal layer 264'. Subsequently, the auxiliary electrode 264 may be formed by etching through the exposed auxiliary metal layer 264' with a second etch gas. In this case, the second etch gas may be a gas which etches a metal layer such as the auxiliary metal layer 264' but does not etch the first planarization layer 250. Subsequently, the shared contact hole CTS may be finished by etching the first planarization layer 250 with a third etch gas to form the undercut and recessed or sunken portion.

Figure 12F:
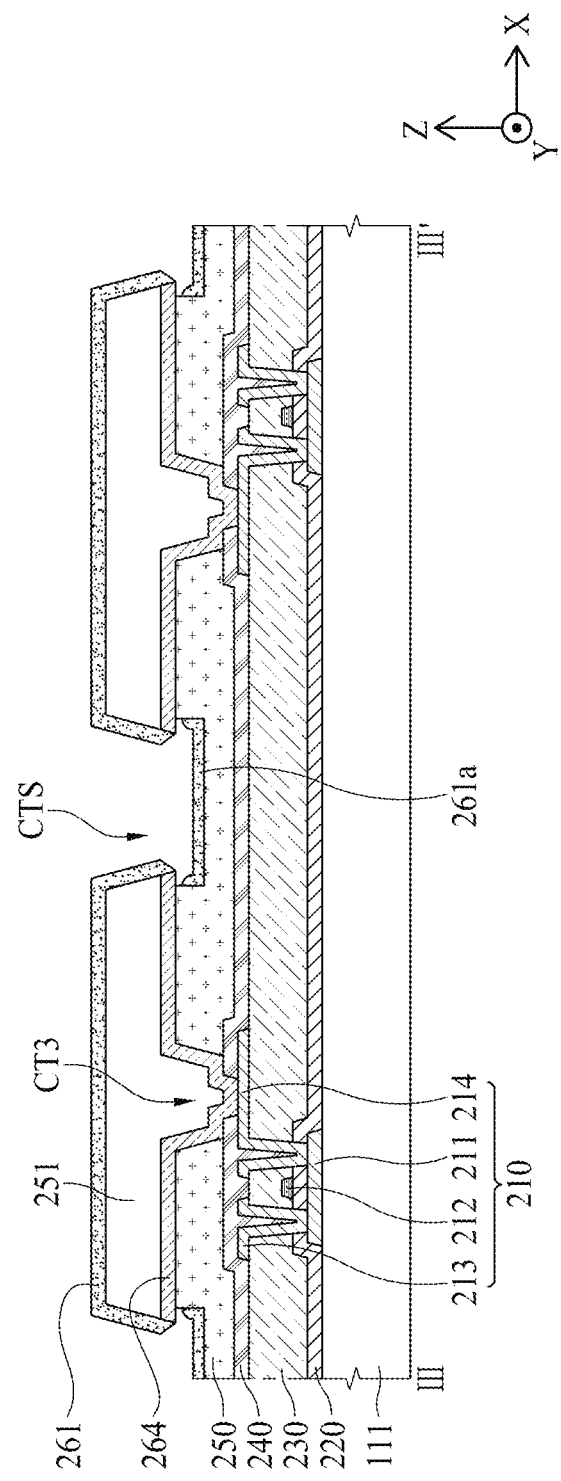

At S206, with reference to FIG. 12F, a first electrode 261 may be formed on the second planarization layer 251 and on the inclined side surface of the shared contact hole CTS.

In detail, a third metal layer may be formed all over the second planarization layer 251 by using a sputtering process, an MOCVD process, an e-BEAM deposition process, an evaporation process, or the like. Subsequently, the first electrode 261 may be formed by patterning the third metal layer through a mask process using a photoresist pattern.

The first electrode 261 may be connected to the side surface of the auxiliary electrode 264 exposed through the shared contact hole CTS. Since the first electrode 261 is connected to only the side surface of the auxiliary electrode 264, a contact resistance of the first electrode 261 and the auxiliary electrode 264 may be high. Therefore, in order to lower the contact resistance of the first electrode 261 and the auxiliary electrode 264, a thickness of the first electrode 261 and a thickness of the auxiliary electrode 264 may be chosen to be thick enough to provide a suitable contact resistance. The thickness of the first electrode 261 and the thickness of the auxiliary electrode 264 may be selected based on the contact resistance of the first electrode 261 and the auxiliary electrode 264, which may be suitably determined through a previous experiment.

Even when the first electrode 261 is formed through the sputtering process, which is good in a step coverage characteristic, the shared contact hole CTS may be formed having a reverse taper shape between the contact region CNT and the floor FL or may be formed in any shape such that the lower surface of the auxiliary electrode 264 may be exposed, and thus, the first electrode 261 may be disconnected in the shared contact hole CTS. The step coverage denotes that a layer deposited by a deposition process is continuously connected without being disconnected even in a portion where a step height is formed.

Moreover, a dummy electrode 261a may be formed on the floor FL of the shared contact hole CTS so as to be disconnected from the first electrode 261. The first electrode 261 and the dummy electrode 261a may be formed through the same process, and thus, may be formed of the same material. For example, the first electrode 261 and the dummy electrode 261a may be formed of a transparent metal material or an opaque metal material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

Figure 12G:
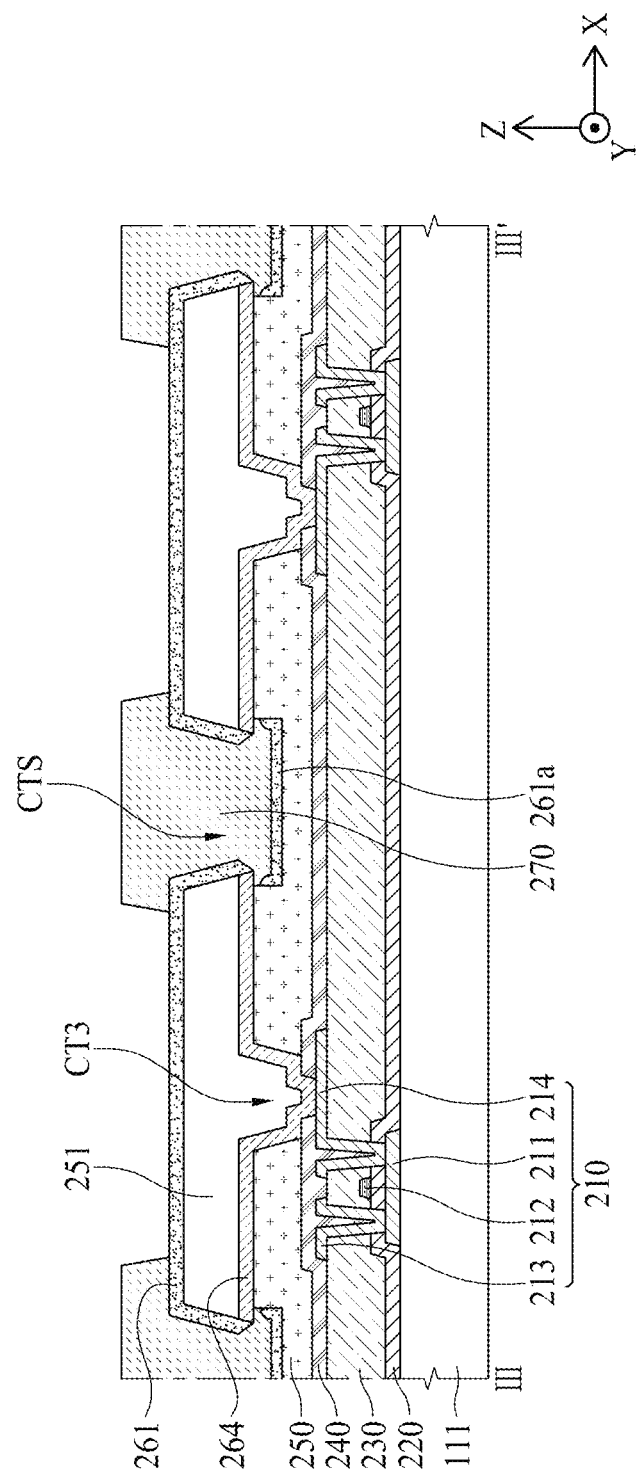

At S207, with reference to FIG. 12G, a bank 270 may be formed to fill the shared contact hole CTS.

The bank 270 may fill the shared contact hole CTS in order for the organic light emitting layer 262 to be uniformly deposited. Also, the bank 270 may be formed on the second planarization layer 251 to cover an edge of the first electrode 261, and to divide a plurality of emissive areas EA. That is, the bank 270 may define the emissive areas EA.

The bank 270 may be formed of an organic layer such as acryl resin, epoxy resin, phenolic resin, polyamide resin, polyimide resin, or the like.

Figure 12H:
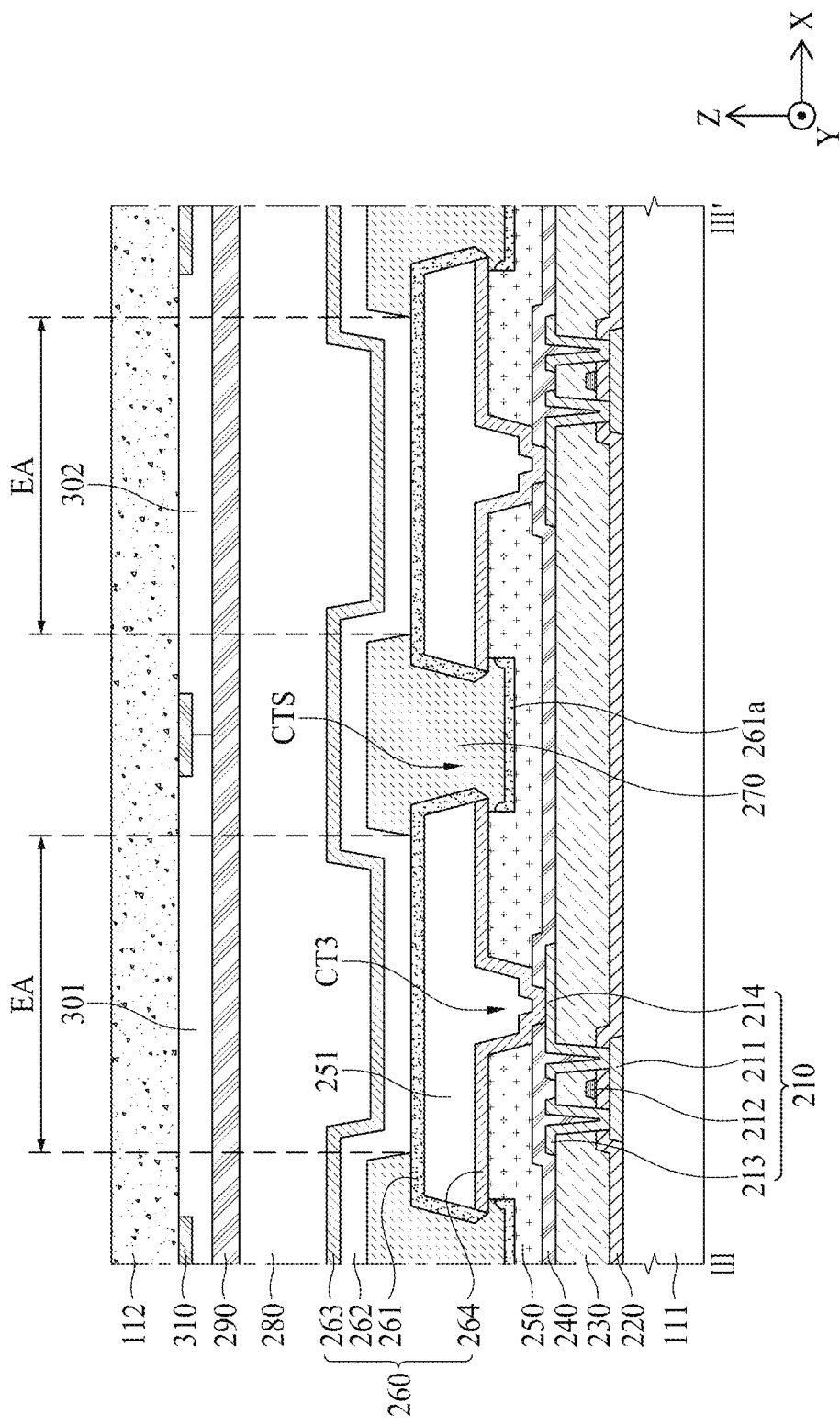

At S208, with reference to FIG. 12H, an organic light emitting layer 262 and a second electrode 263 may be formed on the first electrode 261 and the bank 270.

An operation (S208) of forming the organic light emitting layer 262 and the second electrode 263 in FIG. 12 is substantially the same as the operation (S106) of FIG. 6 described above with reference to FIG. 8F. Thus, a detailed description of the operation (S208) of forming the organic light emitting layer 262 and the second electrode 263 in FIG. 12 is omitted.

As described above, according to an embodiment of the present disclosure, the shared contact hole CTS may be formed by simultaneously etching the second planarization layer 251, the auxiliary metal layer 264', and the first planarization layer 250. Therefore, in an embodiment of the present disclosure, the side surface of the auxiliary electrode 264 may be exposed by the shared contact hole CTS. As a result, in an embodiment of the present disclosure, a size of the drain electrode 214 of the TFT 210 is prevented from being formed less than that of a contact hole, thereby preventing the first electrode 261 from being disconnected in a side surface of the source or drain electrode due to a step height between a floor of the contact hole and the drain electrode 214. Accordingly, in an embodiment of the present disclosure, a turn-on defect where a pixel does not emit light is prevented from occurring.

By way of summation and review, according to the embodiments of the present disclosure, a first electrode may be disconnectedly formed in a shared contact hole. As a result, in the embodiments of the present disclosure, a first electrode of an organic light emitting device of each of adjacent pixels may be electrically connected to a drain electrode of a TFT through the shared contact hole. Therefore, in the embodiments of the present disclosure, N number of pixels may share the shared contact hole for connecting the first electrode of the organic light emitting device to the drain electrode of the TFT. Accordingly, in the embodiments of the present disclosure, an emissive area is prevented from being reduced by the shared contact hole, thereby preventing a lifetime of an organic light emitting layer from being shortened due to the reduction in the emissive area.

Moreover, according to the embodiments of the present disclosure, the shared contact hole may be formed by simultaneously etching a first planarization layer, a passivation layer, a drain metal layer, and an interlayer dielectric. Therefore, in the embodiments of the present disclosure, a side surface of the drain electrode of the TFT may be exposed by the shared contact hole. As a result, in the embodiments of the present disclosure, a size of the drain electrode of the TFT is prevented from being formed less than that of a contact hole, thereby preventing the first electrode from being disconnected in a side surface of the source or drain electrode due to a step height between a floor of a contact hole and the drain electrode. Accordingly, in the embodiments of the present disclosure, a turn-on defect where a pixel does not emit light is prevented from occurring.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:
    a plurality of pixels, each of the pixels including:
        a transistor having a gate electrode, an active layer overlapping the gate electrode, a source electrode connected to one side of the active layer, and a drain electrode connected to another side of the active layer; and
        a light emitting device having a first electrode, a light emitting layer disposed on the first electrode, and a second electrode disposed on the light emitting layer;
    a contact hole, the first electrodes of at least two of the pixels being electrically connected to side surfaces of respective source electrodes or to side surfaces of respective drain electrodes in the contact hole;
    a dummy electrode on a floor of the contact hole, the dummy electrode being electrically isolated from the first electrodes of the at least two pixels;
    a bank that at least partially fills the contact hole; and
    a first planarization layer between the first electrode and at least one of the source electrode and the drain electrode,
    wherein the dummy electrode is on the first planarization layer in the contact hole.

2. The light emitting display device of claim 1 wherein the contact hole is undercut to expose lower surfaces of the respective source electrodes or the respective drain electrodes.

3. The light emitting display device of claim 1 wherein the contact hole includes an entrance having a first width, the floor having a second width, and a contact region positioned between the entrance and the floor and having a third width, the first electrodes are electrically connected to the respective source electrodes or to the respective drain electrodes in the contact region, the third width being less than the first width and the second width.

4. The light emitting display device of claim 3, further comprising a bank in the floor, the contact region, and the entrance of the contact hole.

5. The light emitting display device of claim 1 wherein the dummy electrode and the first electrodes are formed of a same material.

6. The light emitting display device of claim 1 wherein the dummy electrode contacts a first portion of a side surface of the first planarization layer in the contact hole, and the bank contacts a second portion of the side surface of the first planarization layer between the dummy electrode and the source electrode or drain electrode in the contact hole.

7. The light emitting display device of claim 1 wherein the transistor further includes a gate insulation layer disposed between the active layer and the gate electrode, an interlayer dielectric disposed between the gate electrode and the source electrode and between the gate electrode and the drain electrode, and a first planarization layer disposed on the source electrode and the drain electrode, and
    the contact hole extends through the first planarization layer and extends at least partially into the interlayer dielectric.

8. The light emitting display device of claim 1 wherein the at least two pixels includes a first pixel, a second pixel that is adjacent to the first pixel in a first direction, a third pixel that is adjacent to the first pixel in a second direction that is transverse to the first direction, and a fourth pixel that is adjacent to the third pixel in the first direction and adjacent to the second pixel in the second direction.

9. The light emitting display device of claim 1 wherein the at least two pixels includes a first pixel, a second pixel that is adjacent to the first pixel in a first direction, and a third pixel that is adjacent to one of the first pixel or the second pixel in a second direction that is transverse to the first direction.

10. A light emitting display device comprising:
    a plurality of pixels, each of the pixels including:
        a transistor having a gate electrode, a source region, and a drain region;
        a source electrode coupled to the source region;
        a drain electrode coupled to the drain region;
        a first planarization layer on the source electrode and the drain electrode;
        an auxiliary electrode on the first planarization layer and coupled to one of the source electrode or the drain electrode;
        a second planarization layer on the auxiliary electrode, the second planarization layer covering an upper surface of the auxiliary electrode between a first end and a second end of the auxiliary electrode; and
        a first electrode of a light emitting device on the second planarization layer and connected to the auxiliary electrode at the first end and the second end of the auxiliary electrode; and
    a contact hole, the first electrodes of at least two of the pixels being electrically connected to side surfaces of respective auxiliary electrodes in the contact hole.

11. The light emitting display device of claim 10 wherein the contact hole includes an undercut that exposes lower surfaces of the respective auxiliary electrodes.

12. The light emitting display device of claim 10 wherein each of the pixels further includes:
    an auxiliary contact hole that extends through the first planarization layer and exposes a portion of one of the source electrode or the drain electrode, the auxiliary electrode coupled to the exposed portion of the one of the source region or the drain region in the auxiliary contact hole.

13. The light emitting display device of claim 12 wherein each of the pixels further includes:
    a gate insulation layer between the source and drain regions and the gate electrode; and
    an interlayer dielectric between the gate electrode and the source electrode and between the gate electrode and the drain electrode,
    wherein the second planarization layer is disposed in the auxiliary contact hole,
    wherein the contact hole extends through the second planarization layer and extends at least partially into the first planarization layer.

14. The light emitting display device of claim 10 further comprising a bank that at least partially fills the contact hole, the bank forming a non-emissive region of the light emitting display device.

15. The light emitting display device of claim 10 wherein the at least two pixels includes a first pixel, a second pixel that is adjacent to the first pixel in a first direction, a third pixel that is adjacent to the first pixel in a second direction that is transverse to the first direction, and a fourth pixel that is adjacent to the third pixel in the first direction and adjacent to the second pixel in the second direction.

16. The light emitting display device of claim 10 wherein the at least two pixels includes a first pixel, a second pixel that is adjacent to the first pixel in a first direction, and a third pixel that is adjacent to one of the first pixel or the second pixel in a second direction that is transverse to the first direction.

17. A light emitting display device comprising:
a plurality of pixels, each of the pixels including:
  a transistor having a gate electrode, a source region, and a drain region;
  a source electrode coupled to the source region;
  a drain electrode coupled to the drain region;
  a first planarization layer on the source electrode and the drain electrode;
  an auxiliary electrode on the first planarization layer and coupled to one of the source electrode or the drain electrode;
  a second planarization layer on the auxiliary electrode, the second planarization layer covering an upper surface of the auxiliary electrode between a first end and a second end of the auxiliary electrode; and
  a first electrode of a light emitting device on the second planarization layer and coupled to the auxiliary electrode;
a contact hole, the first electrodes of at least two of the pixels being electrically connected to side surfaces of respective auxiliary electrodes in the contact hole; and
a dummy electrode on a floor of the contact hole, the dummy electrode being disconnected from the first electrodes of the at least two pixels.

18. The light emitting display device of claim 17 wherein the at least two pixels includes a first pixel, a second pixel that is adjacent to the first pixel in a first direction, a third pixel that is adjacent to the first pixel in a second direction that is transverse to the first direction, and a fourth pixel that is adjacent to the third pixel in the first direction and adjacent to the second pixel in the second direction.

19. The light emitting display device of claim 17 wherein the at least two pixels includes a first pixel, a second pixel that is adjacent to the first pixel in a first direction, and a third pixel that is adjacent to one of the first pixel or the second pixel in a second direction that is transverse to the first direction.

* * * * *